US012787507B2

(12) United States Patent
Hong et al.

(10) Patent No.: US 12,787,507 B2
(45) Date of Patent: Nov. 3, 2026

(54) DISPLAY APPARATUS HAVING DISPLAY MODULE AND MANUFACTURING METHOD THEREOF

(71) Applicant: SAMSUNG ELECTRONICS CO., LTD., Suwon-si (KR)

(72) Inventors: Soonmin Hong, Suwon-si (KR); Gunwoo Kim, Suwon-si (KR); Seonghwan Shin, Suwon-si (KR); Tackmo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 823 days.

(21) Appl. No.: 18/088,226

(22) Filed: Dec. 23, 2022

(65) Prior Publication Data

US 2023/0275193 A1 Aug. 31, 2023

Related U.S. Application Data

(63) Continuation of application No. PCT/KR2022/020809, filed on Dec. 20, 2022.

(30) Foreign Application Priority Data

Feb. 28, 2022 (KR) ........................ 10-2022-0026191
Apr. 27, 2022 (KR) ........................ 10-2022-0052351

(51) Int. Cl.
*H10H 20/85* (2025.01)
*H10W 72/00* (2026.01)
*H10W 90/00* (2026.01)

(52) U.S. Cl.
CPC ........ *H10H 20/8506* (2025.01); *H10W 90/00* (2026.01); *H10W 72/01351* (2026.01);
(Continued)

(58) Field of Classification Search
None
See application file for complete search history.

(56) References Cited

U.S. PATENT DOCUMENTS 9,658,392 B2 5/2017 Zhang
10,001,665 B2 6/2018 Kwon et al.
(Continued)

FOREIGN PATENT DOCUMENTS

CN 207833802 U 9/2018
CN 210200188 U 3/2020
(Continued)

OTHER PUBLICATIONS

Shin (KR 20210141146 A) (Year: 2021).*
(Continued)

*Primary Examiner* — Hung S. Bui
*Assistant Examiner* — Elisa Sasserath
(74) *Attorney, Agent, or Firm* — Sughrue Mion, PLLC

(57) ABSTRACT

A display module includes: a substrate; a side wiring extending along a side surface of the substrate, the side wiring electrically connecting a TFT layer of the substrate at a first end of the side wiring with a rear wiring layer of the substrate at a second end of the side wiring; a front cover disposed on and bonded with a mounting surface of the substrate; a metal plate disposed on and bonded with the rear surface; a side cover covering the side wiring and the side surface; a waterproof member configured to seal the second end of the side wiring from outside and prevent moisture permeation; and a side end member disposed on and covering the side cover and the waterproof member, and the side end member being grounded to the metal plate.

20 Claims, 9 Drawing Sheets

(52) U.S. Cl.
CPC .... *H10W 72/07311* (2026.01); *H10W 72/074* (2026.01); *H10W 90/732* (2026.01)

(56) References Cited

U.S. PATENT DOCUMENTS

| | | | | |
|---|---|---|---|---|
| 10,333,033 | B2 * | 6/2019 | Kim | H10H 20/8506 |
| 10,462,554 | B2 | 10/2019 | Ham et al. | |
| 11,538,406 | B2 | 12/2022 | Zhao et al. | |
| 11,688,831 | B2 | 6/2023 | Kim et al. | |
| 2004/0231872 | A1 * | 11/2004 | Arnold | H05K 1/0218<br>257/E23.128 |
| 2015/0301266 | A1 * | 10/2015 | Araki | G02B 6/005<br>362/606 |
| 2016/0190522 | A1 | 6/2016 | Lee et al. | |
| 2021/0183837 | A1 | 6/2021 | Shin et al. | |
| 2021/0202907 | A1 | 7/2021 | Lee et al. | |
| 2021/0366378 | A1 | 11/2021 | Zhao et al. | |
| 2022/0045124 | A1 | 2/2022 | Lee et al. | |
| 2022/0084994 | A1 | 3/2022 | Shin | |
| 2023/0005962 | A1 | 1/2023 | Lee et al. | |

FOREIGN PATENT DOCUMENTS

| | | | | | |
|---|---|---|---|---|---|
| CN | 113424323 | A | * | 9/2021 | G09G 3/3225 |
| CN | 114399963 | A | * | 4/2022 | H05K 5/30 |
| CN | 113424323 | B | | 4/2023 | |
| JP | 6383498 | B2 | | 8/2018 | |
| KR | 20-0169110 | Y1 | | 2/2000 | |
| KR | 10-2016-0014922 | A | | 2/2016 | |
| KR | 20160014922 | A | * | 2/2016 | H10H 20/857 |
| KR | 10-2018-0121293 | A | | 11/2018 | |
| KR | 10-2018-0129719 | A | | 12/2018 | |
| KR | 10-2021-0063010 | A | | 6/2021 | |
| KR | 10-2021-0075820 | A | | 6/2021 | |
| KR | 10-2279021 | B1 | | 7/2021 | |
| KR | 10-2021-0141146 | A | | 11/2021 | |
| KR | 20210141146 | A | * | 11/2021 | H01L 25/0753 |
| KR | 10-2022-0018122 | A | | 2/2022 | |

OTHER PUBLICATIONS

Zhao (CN 113424323 A) (Year: 2021).*
Zhao et. al (CN_113424323_A) (Year: 2021).*
Kim et al (KR 20160014922 A) (Year: 2014).*
Zhao et. al (CN 113424323 A) (Year: 2014).*
Wang (CN 114399963 A) (Year: 2022).*
International Search Report (PCT/ISA/210) issued by the International Searching Authority on Apr. 18, 2023 for International Patent Application No. PCT/KR2022/020809.
Written Opinion (PCT/ISA/237) issued by the International Searching Authority on Apr. 18, 2023 for International Patent Application No. PCT/KR2022/020809.
Communication issued on Nov. 22, 2024 from the European Patent Office for European Patent Application No. 22929097.8.
Office Action dated Feb. 4, 2026, issued by Korean Ministry of Intellectual Property in Korean Patent Application No. 10-2022-0052351.

* cited by examiner

DISPLAY APPARATUS HAVING DISPLAY MODULE AND MANUFACTURING METHOD THEREOF

CROSS-REFERENCE TO RELATED APPLICATION

This application is a bypass continuation of International Application No. PCT/KR2022/020809, filed on Dec. 20, 2022, which is based on and claims priority under 35 U.S.C. § 119 to Korean Patent Applications No. 10-2022-0026191, filed on Feb. 28, 2022 and No. 10-2022-0052351, filed on Apr. 27, 2022 in the Korean Intellectual Property Office, the disclosures of which are incorporated by reference herein in their entireties.

BACKGROUND

1. Field

The disclosure relates to a display apparatus for displaying an image by coupling modules in which self-emissive inorganic light-emitting devices are mounted on substrates.

2. Description of the Related Art

A display apparatus is a kind of output apparatus for visually displaying images and data information, such as characters or figures.

Traditionally, a liquid crystal panel requiring a backlight or an Organic Light-Emitting Diode (OLED) panel configured with a film of an organic compound that itself emits light in response to current may be used as a display apparatus. A liquid crystal panel has slow response time and high power consumption, and requires a backlight because itself does not emit light. Accordingly, it is difficult to compactify the liquid crystal panel into thinner form factors. Although an OLED panel requires no backlight and thus is easier to produce with a thin thickness because itself emits light, an OLED panel is vulnerable to a burn-in phenomenon in which, in the case in which the OLED panel displays the same screen for a long time, a certain area of the screen remains as it is after the screen changes to another screen due to short life cycles of sub pixels. For these reasons, as a new panel for replacing the light crystal panel and the OLED panel, a micro light-emitting diode (micro LED or μLED) panel in which inorganic light-emitting devices are mounted on a substrate and the inorganic light-emitting devices themselves are used as pixels is being studied.

The micro light-emitting diode panel (hereinafter, referred to as a micro LED panel), which is a flat display panel, is configured with a plurality of inorganic LEDs each having a size of 100 micrometers or less.

The micro LED panel does not cause the burn-in phenomenon of OLEDs as inorganic light-emitting devices that are self-emissive devices, in addition to having excellent brightness, resolution, consumption power, and durability.

The micro LED panel provides better contrast, response time, and energy efficiency than the LCD panel requiring the backlight. Micro LEDs that are inorganic light-emitting devices have higher brightness, higher light-emitting efficiency, and a longer lifespan than OLEDs although both the OLEDs and micro LEDs have high energy efficiency.

In addition, the micro LEDs may achieve a substrate-level display modulation by arranging LEDs on a circuit board in units of pixels, and provide various resolutions and screen sizes of display.

SUMMARY

Therefore, it is an aspect of the disclosure to provide a display apparatus and a manufacturing method thereof, more particularly, a display module suitable for enlargement and a technical feature about protection of the display module against infiltration of an external solution in a display apparatus including the display module.

Additional aspects of the disclosure will be set forth in part in the description which follows and, in part, will be obvious from the description, or may be learned by practice of the disclosure.

A display module may include: a substrate including: a mounting surface on which a plurality of inorganic light-emitting devices are mounted and a thin film transistor (TFT) layer is formed, a rear surface on which a rear wiring layer is formed, the rear surface being opposite to the mounting surface, and a side surface formed between the mounting surface and the rear surface; a side wiring extending along the side surface, the side wiring electrically connecting the TFT layer at a first end of the side wiring with the rear wiring layer at a second end of the side wiring; a front cover disposed on and bonded with the mounting surface; a metal plate disposed on and bonded with the rear surface; a side cover covering the side wiring and the side surface; a waterproof member configured to seal the second end of the side wiring from outside and prevent moisture permeation; and a side end member disposed on and covering the side cover and the waterproof member, and the side end member being grounded to the metal plate.

The waterproof member may be made of a water repellent material.

A first direction may be defined as a vector orthogonal to the front cover towards the metal plate. The waterproof member may be disposed in the first direction with respect to the side cover.

A second direction may be defined as a vector orthogonal to the side cover towards the substrate. The waterproof member may be disposed in the second direction with respect to the side cover.

The front cover may extend along the mounting surface in a third direction beyond an outer area of the mounting surface, the third direction being opposite to the second direction. The side cover may extend in the first direction from a lower surface of the front cover beyond the outer area of the mounting surface. The waterproof member may extend in the first direction and the second direction to cover the second end of the side wiring from a lower portion of the side cover.

The side end member may be configured to cover at least a portion of the side cover in a third direction, the waterproof member, and a side surface of the metal plate, the side end member including a first end disposed on the side cover and a second end positioned on the side surface of the metal plate, the third direction being defined as a vector orthogonal to the side cover away from the substrate.

The display module may further include a front waterproof member extending from the first end of the side end member to at least a portion of a side end of the front cover, the front waterproof member being configured to seal a region between the side cover and the front cover from the outside.

The display module may further comprising a rear waterproof member extending from the second end of the side end member to at least a portion of the metal plate, the rear waterproof member being configured to seal a region between the side end member and the metal plate from the outside.

The waterproof member may not be disposed on a side end of the side cover.

The waterproof member may be less thick than the side end member.

The waterproof member may include a fluorine resin.

The side end member may be made of metal.

The side cover may be made of a light absorbing material.

A display panel may include: a plurality of display modules; and a frame configured to arrange the plurality of display modules adjacent to each other. Each of the plurality of display modules may include: a substrate including: a mounting surface on which a plurality of inorganic light-emitting devices are mounted and a thin film transistor (TFT) layer is formed, a rear surface on which a rear wiring layer is formed, the rear surface being opposite to the mounting surface, and a side surface formed between the mounting surface and the rear surface; a side wiring extending along the side surface, the side wiring electrically connecting the TFT layer at a first end of the side wiring with the rear wiring layer at a second end of the side wiring; a front cover disposed on and bonded with the mounting surface; a metal plate disposed on and bonded with the rear surface; a side cover covering the side wiring and the side surface; a waterproof member configured to seal the second end of the side wiring from outside and prevent moisture permeation; and a side end member disposed on and covering the side cover and the waterproof member, and the side end member being grounded to the metal plate.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
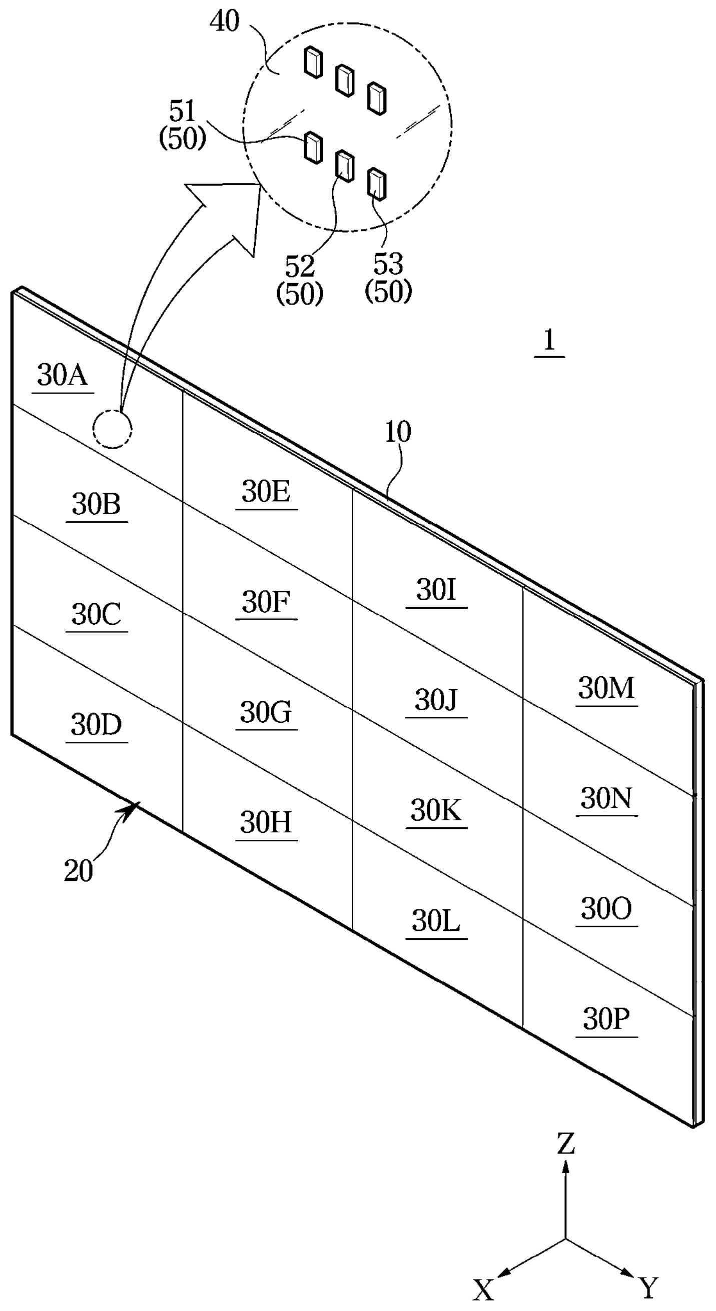
FIG. 1 shows a display apparatus according to an embodiment of the disclosure.

The embodiments described in the present specification are only the most preferred embodiments of the disclosure and do not represent all of the technical idea of the disclosure. It should be understood that various equivalents or variations that may be substituted for them at the time of the present application belong to the scope of rights of the disclosure.

It is to be understood that the singular forms "a," "an," and "the" include plural referents unless the context clearly dictates otherwise. In the drawings, for easy understanding, the shapes or sizes of components are more or less exaggeratedly shown.

It will be understood that when the terms "includes," "comprises," "including," and/or "comprising," when used in this specification, specify the presence of stated features, figures, steps, operations, components, members, or combinations thereof, but do not preclude the presence or addition of one or more other features, figures, steps, operations, components, members, or combinations thereof.

Also, in this specification, the meaning of 'identical' may include similar in attribute or similar within a certain range. Also, the term 'identical' means 'substantially identical'. The meaning of 'substantially identical' needs to be understood that a value falling within the margin of error in manufacturing or a value corresponding to a difference within a meaningless range with respect to a reference value is included in the range of 'identical'.

Throughout the disclosure, the expression "at least one of a, b or c" indicates only a, only b, only c, both a and b, both a and c, both b and c, all of a, b, and c, or variations thereof.

Hereinafter, embodiments of the disclosure will be described in detail with reference to the accompanying drawings.

Figure 2:
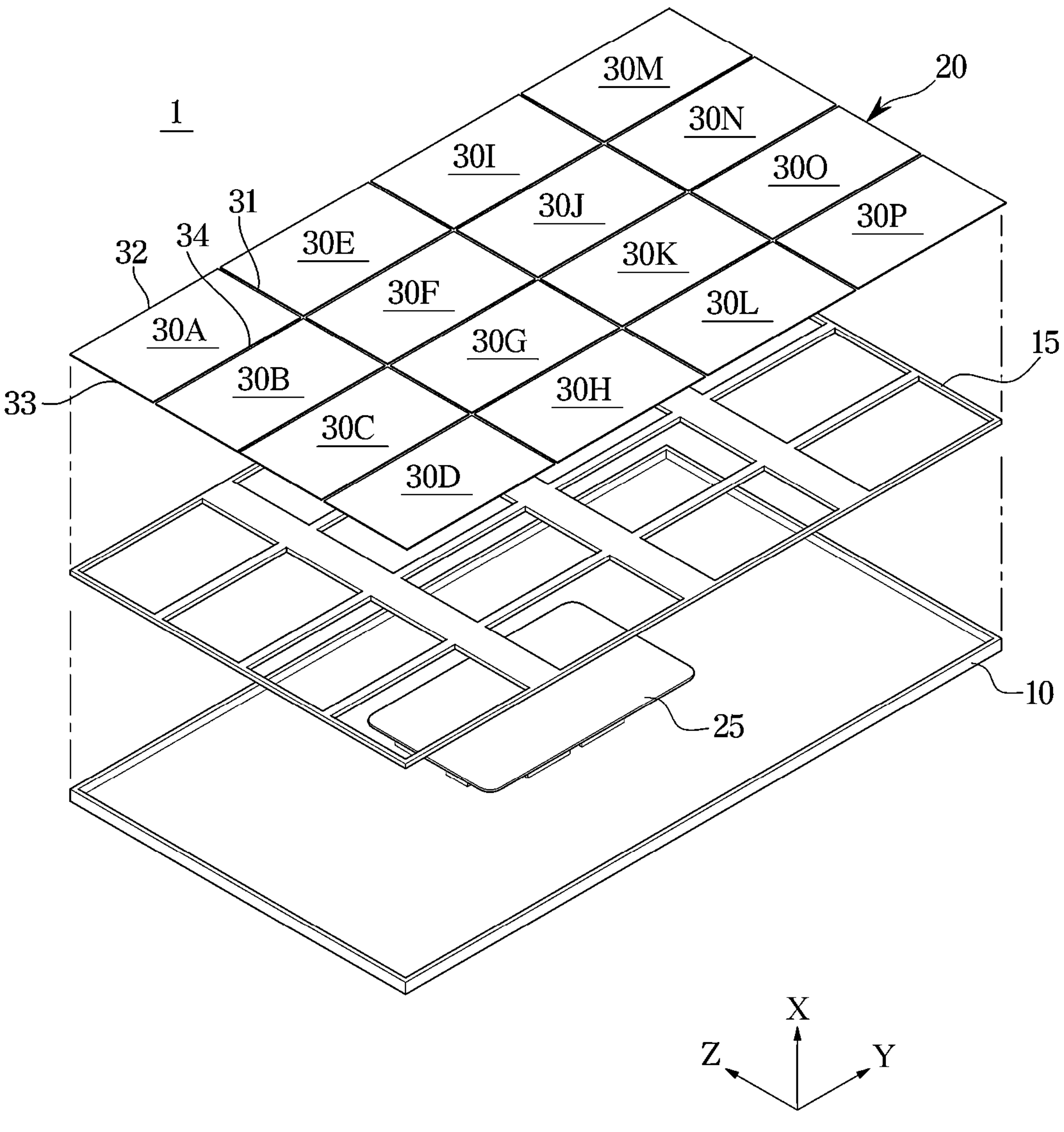
FIG. 2 is an exploded view showing main components of the display apparatus of FIG. 1.
Figure 3:
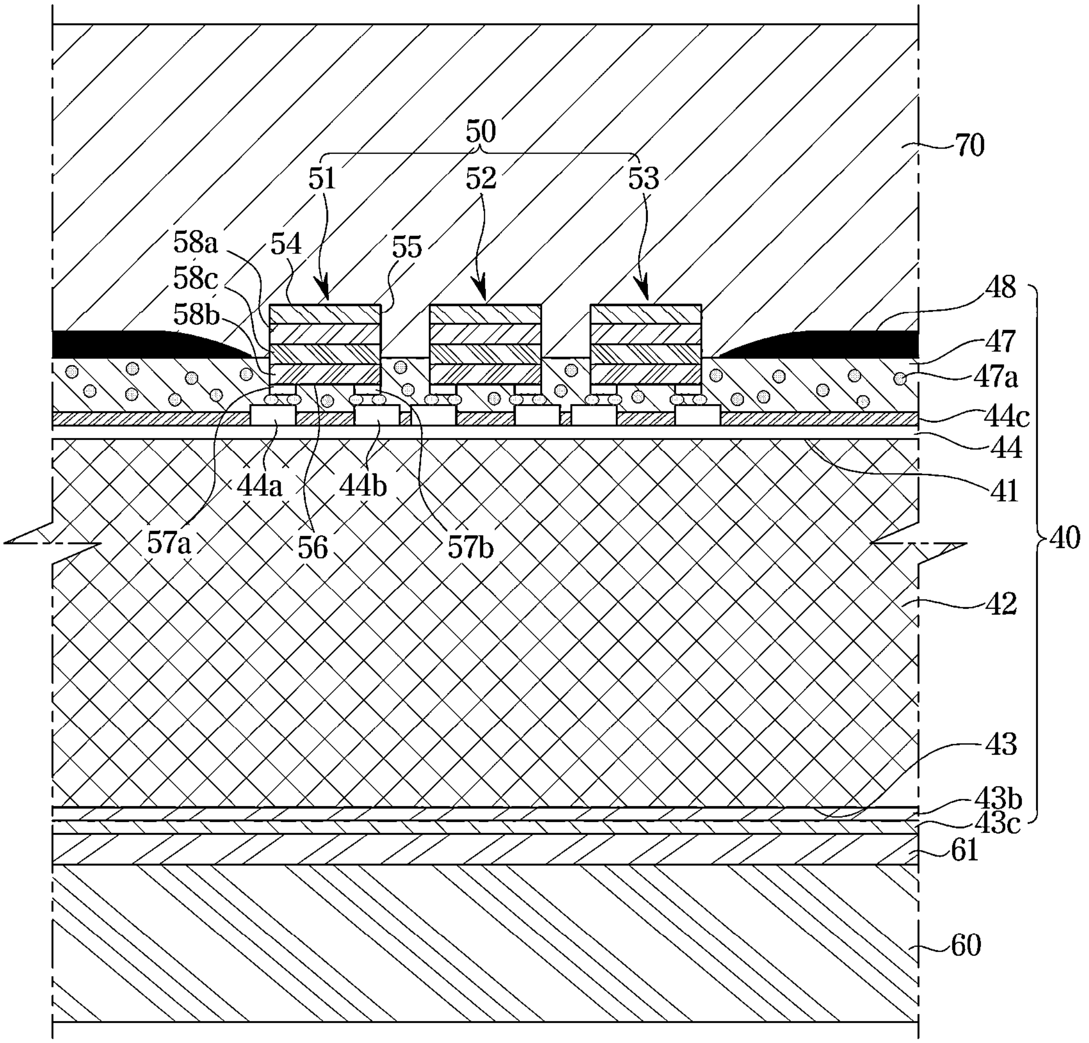
FIG. 3 is an enlarged cross-sectional view showing some components of a display module shown in FIG. 1.
Figure 4:
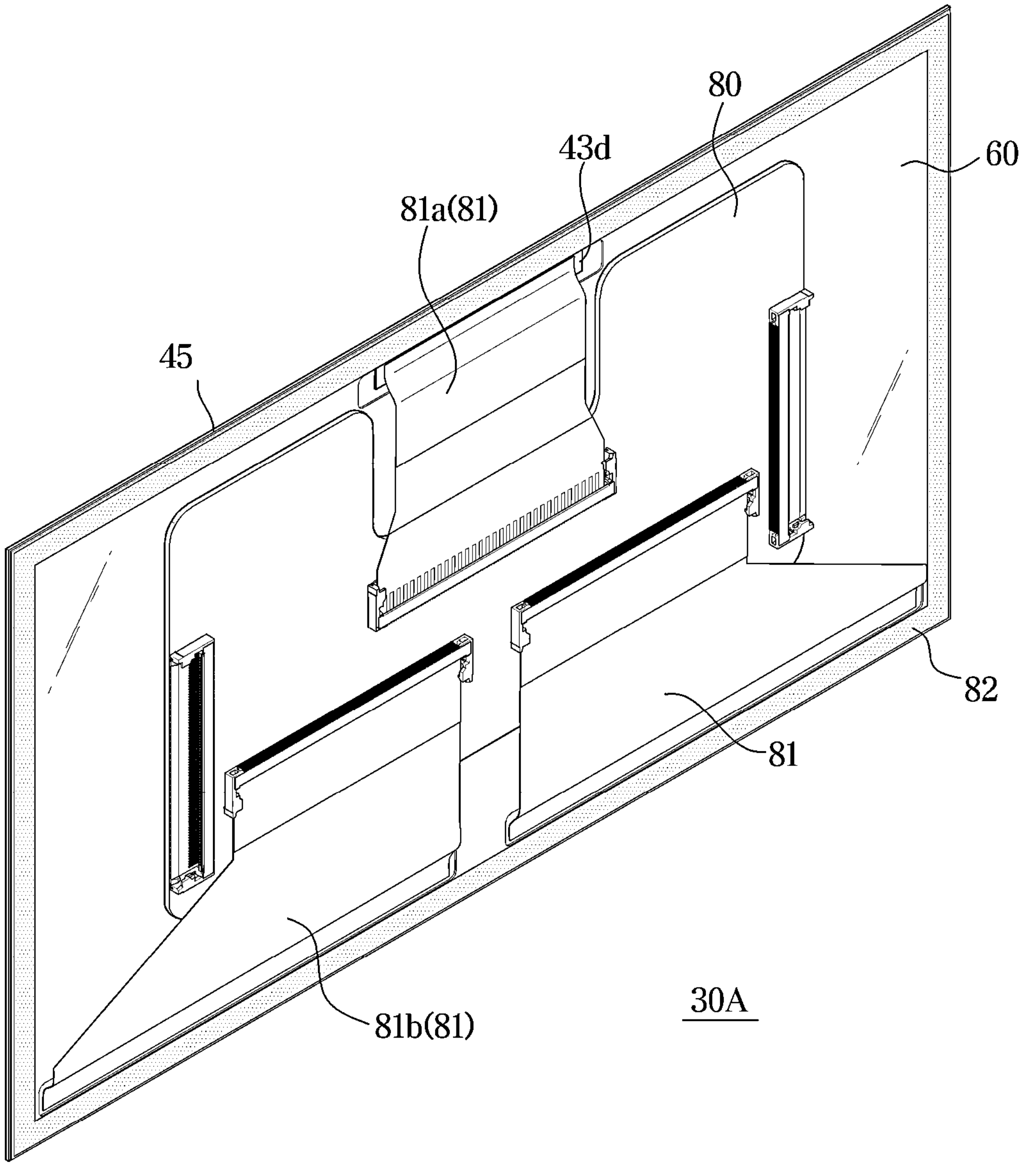
FIG. 4 is a rear perspective view of the display module of the display apparatus shown in FIG. 1.
Figure 5:
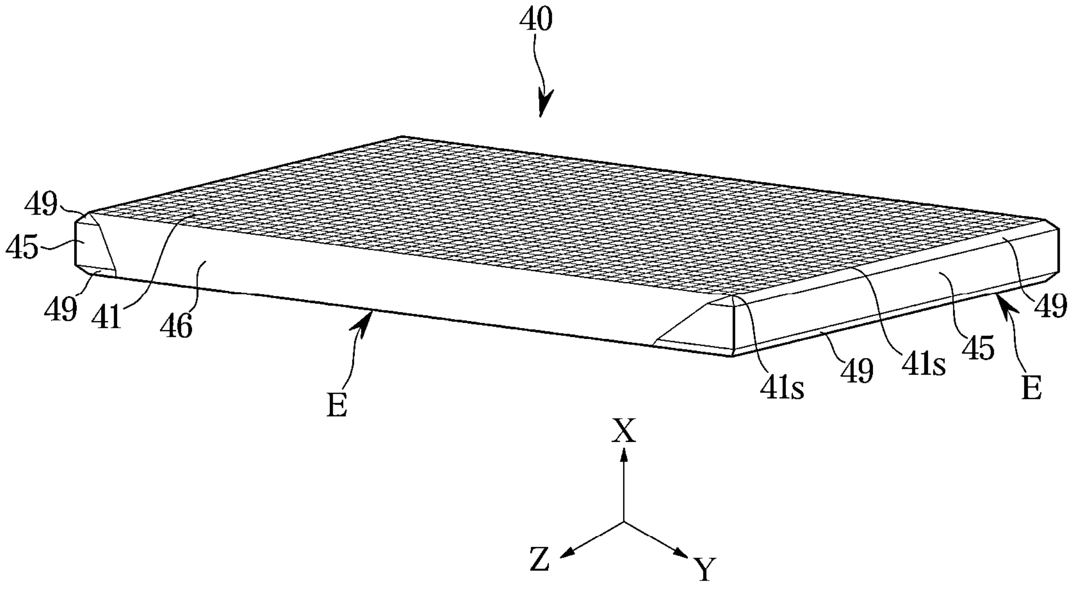
FIG. 5 is a perspective view of some components of the display module shown in FIG. 1.

FIG. 1 shows a display apparatus according to an embodiment of the disclosure. FIG. 2 is an exploded view showing main components of the display apparatus of FIG. 1. FIG. 3 is an enlarged cross-sectional view showing some components of a display module shown in FIG. 1. FIG. 4 is a rear perspective view of the display module of the display apparatus shown in FIG. 1. FIG. 5 is a perspective view of some components of the display module shown in FIG. 1.

Some components of a display apparatus 1, including a plurality of inorganic light-emitting devices 50, shown in the drawings may be micro-scale components each having a size of several micrometers (μm) to hundreds of micrometers (μm), and for convenience of description, some components (the plurality of inorganic light-emitting devices 50, a black matrix 48, etc.) are exaggerated in scale.

The display apparatus 1 may be an apparatus for displaying, for example, information, materials, and/or data, in characters, figures, graphs, and/or images. The display apparatus 1 may be implemented as a television (TV), a personal computer (PC), a mobile device, a digital signage, or any other electronic device configured to display digital content.

As shown in FIGS. 1 and 2, the display apparatus 1 may include a display panel 20 for displaying an image, a power supply (not shown) for supplying power to the display panel 20, a main board 25 for controlling overall operations of the display panel 20, a frame 15 supporting the display panel 20, and a rear cover 10 covering a rear surface of the frame 15.

The display panel 20 may include a plurality of display modules 30A to 30P, a driving board (not shown) for driving the display modules 30A to 30P, and a timing controller (TOCN) board for generating timing signals for controlling the display modules 30A to 30P.

The rear cover 10 may support the display panel 20. The rear cover 10 may be installed on a floor through a stand (not shown), or mounted on a wall through a hanger (not shown), etc.

The plurality of display modules 30A to 30P may be arranged in up, down, left, and right directions to be adjacent to each other. The plurality of display modules 30A to 30P may be arranged in a M*N matrix form. In some embodiments, 16 display modules 30A to 30P may be arranged in a 4*4 matrix form. However, a number and arrangement of the plurality of display modules 30A to 30P are not limited.

The plurality of display modules 30A to 30P may be mounted on the frame 15. The plurality of display modules 30A to 30P may be mounted on the frame 15 by various known methods, such as a magnetic force generated by a magnet or a mechanical insert structure. A rear side of the frame 15 may be coupled with the rear cover 10, and the rear cover 10 may form a rear outer appearance of the display apparatus 1.

The rear cover 10 may include a metal material. Accordingly, heat generated from the plurality of display modules 30A to 30P and the frame 15 may be easily transferred to the rear cover 10, which raises heat dissipation efficiency of the display apparatus 1.

As such, the display apparatus 1 may implement a large screen by tiling the plurality of display modules 30A to 30P.

Each of the plurality of display modules 30A to 30P may be applied to a display apparatus. That is, the display modules 30A to 30P may be, in unit of a piece, installed in and applied to a wearable device, a portable device, a handheld device, and various electronic products or electronic parts requiring a display, Also, the display modules 30A to 30P may be applied to a display apparatus, such as a monitor for PC, a high-resolution TV, a signage, and/or an electronic display, by being assembled and arranged in a matrix type.

The plurality of display modules 30A to 30P may have the same configuration. Accordingly, the following description about a display module may be applied in the same way to all the other display modules.

Hereinafter, a first display module 30A of the plurality of display modules 30A to 30P will be described because the plurality of display modules 30A to 30P may have the same configuration.

Accordingly, to avoid duplicate descriptions, as components of the plurality of display modules 30A to 30P, a display module 30, a substrate 40, and a front cover 70 will be representatively described.

The first display module 30A of the plurality of display modules 30A to 30P and a third display module 30E being adjacent to the first display module 30A in a second direction Y or a second display module 30B being adjacent to the first display module 30A in a third direction Z will be described as necessary.

The first display module 30A of the plurality of display modules 30A to 30P may be formed, for example, in a quadrangle shape. The first display module 30A may be formed in a rectangle shape or a square shape.

Accordingly, the first display module 30A may include edges 31, 32, 33, and 34 positioned in up, down, left, and right directions with respect to a first direction X which is a front direction.

As shown in FIG. 3, each of the plurality of display modules 30A to 30P may include the substrate 40, and the plurality of inorganic light-emitting devices 50 mounted on the substrate 40. The plurality of inorganic light-emitting devices 50 may be mounted on a mounting surface 41 of the substrate 40 toward the first direction X. In FIG. 3, for convenience of depiction, a thickness in first direction X of the substrate 40 is exaggerated for clarity.

The substrate 40 may be formed in a quadrangle shape. As described above, because each of the plurality of display modules 30A to 30P is formed in a quadrangle shape, the substrate 40 may also be formed in a quadrangle shape correspondingly.

The substrate 40 may be formed in a quadrangle shape or a square shape.

Accordingly, in the example of the first display module 30A, the substrate 40 may include four edges E corresponding to the edges 31, 32, 33, and 34 of the first display module 30A, positioned in the up, down, left, and right directions with respect to the first direction X which is the front direction (see FIG. 5).

The first display module 30A may include a right edge 31, an upper edge 32, a left edge 33, and a lower edge 34 in the first direction X being the front direction in which a screen of the first display module 30A is displayed. The right edge 31 may be opposite to the left edge 33 in the second direction Y being a left-right direction, and the upper edge 32 may be opposite to the lower edge 34 in the third direction Z being an up-down direction.

The substrate 40 may include a substrate body 42, a mounting surface 41 forming one surface of the substrate body 42, a rear surface 43 forming the other surface of the substrate body 42 and being opposite to the mounting surface 41, and a side surface 45 positioned between the mounting surface 41 and the rear surface 43.

The side surface 45 may form a side end of the substrate 40 in the second direction Y and the third direction Z that are orthogonal to the first direction X.

The substrate 40 may include a chamfer portion 49 formed between the mounting surface 41 and the side surface 45 and between the rear surface 43 and the side surface 45.

The chamfer portion 49 may prevent, upon an arrangement of the plurality of display modules 30A to 30P, each substrate 40 from colliding with another one(s) and being damaged.

The edges E of the substrate 40 may include the side surface 45 and the chamfer portion 49.

The substrate 40 may include a thin film transistor (TFT) layer 44 formed on the substrate body 42 to drive the inorganic light-emitting devices 50. The substrate body 42 may include a glass substrate. That is, the substrate 40 may include a chip on glass (COG) type substrate. On the substrate 40, a first pad electrode **44*a* and a second pad electrode 44*b* may be formed to electrically connect the inorganic light-emitting devices 50 with the TFT layer 44**.

TFTs included in the TFT layer 44 are not limited to specific structures or types, and may be implemented as various embodiments. That is, TFTs of the TFT layer 44 may be implemented as low temperature poly silicon (LTPS) TFTs, oxide TFTs, Si (poly silicon or a-silicon) TFTs, organic TFTs, or graphene TFTs.

Also, the TFT layer 44 may be replaced with complementary metal-oxide semiconductor (CMOS) type, n-type MOSFT, or p-type MOSFET transistors, in a case in which the substrate body 42 of the substrate 40 is a silicon wafer.

The plurality of inorganic light-emitting devices 50 may be formed of an inorganic material, and each of the inorganic light-emitting devices 50 may have sizes of several micrometers (μm) to hundreds of micrometers (μm) in width, length, and height. A micro inorganic light-emitting device may have a shorter side length of 100 μm or less of a width, length, or height. That is, the inorganic light-emitting devices 50 may be picked up from a sapphire or silicon wafer and then directly transferred onto the substrate 40. The plurality of inorganic light-emitting devices 50 may be picked up and conveyed through an electrostatic method using an electrostatic head or a stamp method using an elastic polymer material, such as PDMS or silicon, as a head.

Each of the plurality of inorganic light-emitting devices 50 may be a light-emitting structure including an n-type semiconductor 58*a*, an active layer 58*c*, a p-type semiconductor 58*b*, a first contact electrode 57*a*, and a second contact electrode 57*b*.

For example, any one of the first contact electrode 57*a* or the second contact electrode 57*b* may be electrically connected with the n-type semiconductor 58*a*, and the other one may be electrically connected with the p-type semiconductor 58*b*.

The first contact electrode 57*a* and the second contact electrode 57*b* may be of a flip chip configuration arranged horizontally toward the same direction (an opposite direction of a light-emitting direction).

Each inorganic light-emitting device 50 may include a light-emitting surface 54 positioned toward the first direction X upon being mounted on the mounting surface 41, a side surface 55, and a bottom surface 56 being opposite to the light-emitting surface 54, and the first contact electrode 57*a* and the second contact electrode 57*b* may be formed on the bottom surface 56.

That is, the first and second contact electrodes 57*a* and 57*b* of the inorganic light-emitting device 50 may be opposite to the light-emitting surface 54, and accordingly, the first and second contact electrodes 57*a* and 57*b* may be positioned in the opposite direction of the light-emitting direction.

The first and second contact electrodes 57*a* and 57*b* may face the mounting surface 41, and be electrically connected with the TFT layer 44. Also, the light-emitting surface 54 through which light is irradiated may be positioned in an opposite direction of the direction in which the first and second contact electrodes 57*a* and 57*b* are positioned.

Accordingly, light generated by the active layer 58*c* may be irradiated toward the first direction X through the light-emitting surface 54, without any interference by the first and second contact electrodes 57*a* and 57*b*.

That is, the first direction X may be defined as a direction in which the light-emitting surface 54 is positioned to irradiate light.

The first contact electrode 57*a* and the second contact electrode 57*b* may be electrically connected respectively with the first pad electrode 44*a* and the second pad electrode 44*b* formed on the mounting surface 41 of the substrate 40.

The inorganic light-emitting device 50 may be connected directly with the first and second pad electrodes 44*a* and 44*b* through an anisotropic conductive layer 47 or a bonding material such as a solder.

On the substrate 40, the anisotropic conductive layer 47 may be formed to mediate an electrical connection between the first and second contact electrodes 57*a* and 57*b* and the first and second pad electrodes 44*a* and 44*b*. The anisotropic conductive layer 47 may be formed by applying an anisotropic conductive adhesive on a protective film, and may have a structure in which conductive balls 47*a* are distributed in an adhesive resin. Each conductive ball 47*a* may be a conductive sphere surrounded by a thin insulating film, and as a result of breaking of the insulating film by pressure, the conductive ball 47 may electrically connect a conductor with another one.

The anisotropic conductive layer 47 may include an anisotropic conductive film (ACF) being in a form of a film, and an anisotropic conductive paste (ACP) being in a form of a paste.

In some embodiments, the anisotropic conductive layer 47 may be provided as an anisotropic conductive film.

Accordingly, the insulating films of the conductive balls 47*a* may be broken by pressure applied to the anisotropic conductive layer 47 upon mounting of the plurality of inorganic light-emitting devices 50 on the substrate 40, and as a result, the first and second contact electrodes 57*a* and 57*b* of the inorganic light-emitting devices 50 may be electrically connected with the first and second pad electrodes 44*a* and 44*b* of the substrate 40.

Although not shown in the drawings, the plurality of inorganic light-emitting devices 50 may be mounted on the substrate 40 through a solder (not shown), instead of the anisotropic conductive layer 47. By performing a reflow process after arranging the inorganic light-emitting devices 50 on the substrate 40, the inorganic light-emitting devices 50 may be bonded on the substrate 40.

The plurality of inorganic light-emitting devices 50 may include a red light-emitting device 51, a green light-emitting device 52, and a blue light-emitting device 53. The inorganic light-emitting devices 50 may be mounted in unit of a group including a series of a red light-emitting device 51, a green light-emitting device 52, and a blue light-emitting device 53 on the mounting surface 41 of the substrate 40. The series of the red light-emitting device 51, the green light-emitting device 52, and the blue light-emitting device 53 may form a pixel. In this case, each of the red light-emitting device 51, the green light-emitting device 52, and the blue light-emitting device 53 may form a sub pixel.

The red light-emitting device 51, the green light-emitting device 52, and the blue light-emitting device 53 may be aligned with preset intervals. However, the red light-emitting device 51, the green light-emitting device 52, and the blue light-emitting device 53 may be arranged in another form such as a triangle.

The substrate 40 may include a light absorbing layer 44*c* for absorbing external light to improve contrast. The light absorbing layer 44*c* may be formed on the entire of the mounting surface 41 of the substrate 40. The light absorbing layer 44*c* may be formed between the TFT layer 44 and the anisotropic conductive layer 47.

The plurality of display modules 30A to 30P may further include the black matrix 48 formed between the plurality of inorganic light-emitting devices 50.

The black matrix 48 may function to supplement the light absorbing layer 44*c* formed on the entire of the mounting surface 41 of the substrate 40. That is, the black matrix 48 may improve contrast of a screen by absorbing external light such that the substrate 40 is shown to be black.

The black matrix 48 may have a black color.

In some embodiments, the black matrix 48 may be positioned between pixels each formed by a series of a red light-emitting device 51, a green light-emitting device 52, and a blue light-emitting device 53. However, the black matrix 48 may be formed more finely to partition the red light-emitting device 51, the green light-emitting device 52, and the blue light-emitting device 53 that are sub pixels.

The black matrix 48 may be formed in a shape of a lattice having a horizontal pattern and a vertical pattern to be positioned between the pixels.

The black matrix 48 may be formed by applying a light absorbing ink on the anisotropic conductive layer 47 through an ink-jet process and then hardening the light absorbing ink or by coating the anisotropic conductive layer 47 with a light absorbing film.

That is, the black matrix 48 may be formed in areas between the plurality of inorganic light-emitting devices 50, in which none of the plurality of inorganic light-emitting devices 50 is mounted, on the anisotropic conductive layer 47 formed on the entire of the mounting surface 41.

Each of the plurality of display modules 30A to 30P may include a front cover 70 positioned in the front direction X on the mounting surface 41 of the display module 30A to 30P to cover the mounting surface 41.

Figure 6:
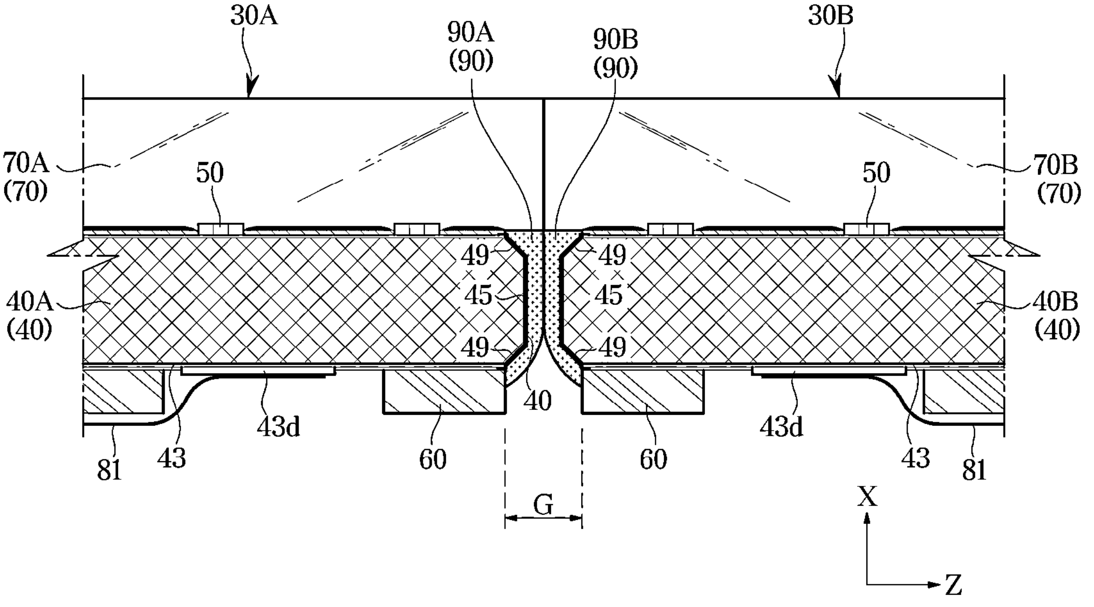
FIG. 6 is a cross-sectional view of some components of the display apparatus shown in FIG. 1, taken along a third direction.
Figure 7:
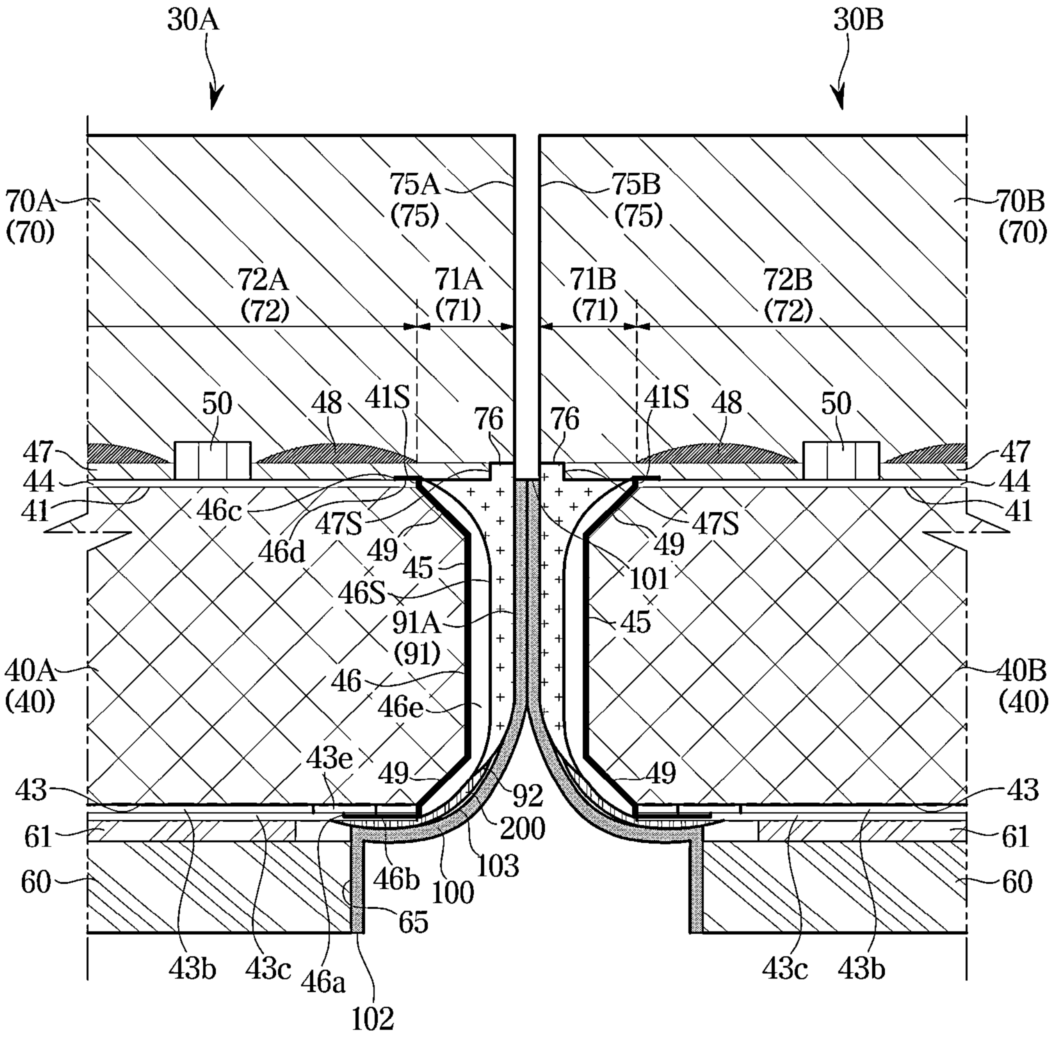
FIG. 7 is an enlarged cross-sectional view of the some components shown in FIG. 6.

A plurality of front covers 70 may be respectively formed on the plurality of display modules 30A to 30P in the first direction X (see FIGS. 6 and 7).

The plurality of display modules 30A to 30P may be assembled with each other after the front covers 70 are respectively formed on the display modules 30A to 30P. That is, in an example of the first display module 30A and the second display module 30B among the plurality of display modules 30A to 30P, a first front cover 70A may be formed on the mounting surface 41 of the first display module 30A and a second front cover 70B may be formed on the mounting surface 41 of the second display module 30B.

The front cover 70 may cover the substrate 40 to protect the substrate 40 against an external force or outside water.

A plurality of layers (not shown) of the front cover 70 may be provided as functional films having optical performance. The plurality of layers will be described in detail, below.

A part of the plurality of layers of the front cover 70 may include a base layer (not shown) formed of an optical clear resin (OCR). The base layer (not shown) may support the other layers (not shown). The OCR may be in a very transparent state because the OCR has transmittance of 90% or more.

The OCR may improve visibility and image quality by raising transmittance through a low reflection property. That is, in a structure having an air gap, light loss occurs due to a refractive index difference between a film layer and an air layer. However, in a structure having an OCR, such a refractive index difference may be reduced to decrease light loss, resulting in an improvement of visibility and image quality.

That is, the OCR may improve image quality, in addition to protecting the substrate 40.

A part of the plurality of layers (not shown) of the front cover 70 may include an adhesive layer (not shown) for bonding the front cover 70 with the mounting surface 41 of the substrate 40.

The front cover 70 may have a height that is greater than or equal to a preset height in the first direction X in which the mounting surface 41 or the light-emitting surface 54 faces.

The front cover 70 formed on the substrate 40 may have a height capable of sufficiently filling a gap that may be formed between the plurality of inorganic light-emitting devices 50 with respect to the front cover 70.

Each of the plurality of display modules 30A to 30P may include a metal plate 60 positioned on a rear surface 43 of the substrate 40.

Also, each of the plurality of display modules 30A to 30P may include a rear adhesive tape 61 positioned between the rear surface 43 of the substrate 40 and the metal plate 60 to bond the rear surface 43 with the metal plate 60.

The rear adhesive tape 61 may be a double-sided adhesive tape. However, the rear adhesive tape 61 is not limited to a double-sided adhesive tape, and may be an adhesive layer, not a tape. That is, the rear adhesive tape 61 may be an embodiment of a medium for bonding the metal plate 60 with the rear surface 43 of the substrate 40, and the rear adhesive tape 61 may be provided as one of various mediums, without being limited to a tape.

The plurality of inorganic light-emitting devices 50 may be electrically connected with a pixel driving wiring (not shown) formed on the mounting surface 41, and a front wiring layer (not shown) extending through the side surface 45 of the substrate 40 and formed with a pixel driving wiring (not shown).

The front wiring layer (not shown) may be formed below the anisotropic conductive layer 47. The front wiring layer (not shown) may be electrically connected with a side wiring 46 formed on the side surface 45 of the substrate 40. The side wiring 46 may be provided in a form of a thin film. The side wiring 46 may include a coating member 46*e* surrounding the side wiring 46 to prevent the side wiring 46 from being exposed to outside and damaged (see FIG. 7).

The side wiring 46 may extend to the rear surface 43 of the substrate 40 in the third direction Z along the chamfer portion 46 and the side surface 45 of the substrate 40 extending in the third direction Z. That is, the side wiring 46 may extend to the rear surface 43 of the substrate 40 from the upper edge 32 and the lower edge 34 along the chamfer portion 49 and the side surface 45 of the substrate 40, although not limited thereto.

However, the side wiring 46 may extend to the rear surface 43 of the substrate 40 in the second direction Y, not in the third direction Z, along the chamfer portion 49 and the side surface 45 of the substrate 40 extending in the second direction Y, although not limited thereto.

However, the side wiring 46 may extend along the edges E of the substrate 40, corresponding to at least two edges of the four edges 31, 32, 33, and 34 of the first display module 30A. The front wiring layer (not shown) may be connected with the side wiring 46 by a front pad (not shown) formed on the edges E of the mounting surface 41.

The side wiring 46 may extend along the side surface 45 of the substrate 40 and be connected with a rear wiring layer 43*b* formed on the rear surface 43. More specifically, the side wiring 46 may be connected with a rear pad 43*e* for electrically connecting the rear wiring layer 43*b* with the side wiring 46. The rear pad 43*e* may be formed at edges E of the rear surface 43 of the substrate 40.

An insulating layer 43*c* may be formed on the rear wiring layer 43*b* in a direction which the rear surface 43 of the substrate 40 faces, to cover the rear wiring layer 43*b*.

That is, the plurality of inorganic light-emitting devices 50 may be electrically connected with the front wiring layer (not shown), the side wiring 46, and the rear wiring layer 43*b*, sequentially.

Also, as shown in FIG. 4, the first display module 30A may include a driving circuit board 80 for electrically controlling the plurality of inorganic light-emitting devices 50 mounted on the mounting surface 41. The driving circuit board 80 may be a printed circuit board. The driving circuit board 80 may be positioned on the rear surface 43 of the substrate 40 in the first direction X. The driving circuit board 80 may be positioned on the metal plate 60 bonded on the rear surface 43 of the substrate 40.

The first display module 30A may include a flexible film 81 connecting the driving circuit board 80 with the rear wiring layer 43*b* to electrically connect the driving circuit board 80 with the plurality of inorganic light-emitting devices 50.

More specifically, one end of the flexible film 81 may be connected with a connecting pad 43*d* positioned on the rear surface 43 of the substrate 40 and electrically connected with the plurality of inorganic light-emitting devices 50.

The connecting pad 43*d* may be electrically connected with the rear wiring layer 43*b*. Accordingly, the connecting pad 43*d* may electrically connect the rear wiring layer 43*b* with the flexible film 81.

Because the flexible film 81 is electrically connected with the connecting pad 43*d*, the flexible film 81 may transfer power and an electrical signal from the driving circuit board 80 to the plurality of inorganic light-emitting devices 50.

The flexible film 81 may be a flexible flat cable (FFC) or a chip on film (COF).

The flexible film 81 may include a first flexible film 81*a* and a second flexible film 81*b* respectively positioned in the up and down directions with respect to the first direction X which is the front direction, although not limited thereto.

However, the first and second flexible films 81*a* and 81*b* may be positioned in the left and right directions with respect to the first direction X, or in at least two directions of the up, down, left, and right directions with respect to the first direction X.

A plurality of second flexible films 81*b* may be provided, although not limited thereto. However, a single second flexible film 81*b* may be provided, and a plurality of first flexible films 81*a* may also be provided.

The first flexible film 81*a* may transfer a data signal from the driving circuit board 80 to the substrate 40. The first flexible film 81*a* may be a COF, although not limited thereto.

The second flexible film 81*b* may transfer power from the driving circuit board 80 to the substrate 40. The second flexible film 81*b* may be a FFC, although not limited thereto.

However, the first flexible film 81*a* and the second flexible film 81*b* may be a FFC and a COF, respectively.

The driving circuit board 80 may be electrically connected with the main board 25 (see FIG. 2), although not shown in the drawings. The main board 25 may be positioned behind the frame 15, and the main board 25 may be connected with the driving circuit board 80 through a cable (not shown) behind the frame 15.

On a rear surface of the metal plate 60, a fixing member 82 for bonding the display modules 30A to 30P to the frame 15 may be positioned. The fixing member 82 may be a double-sided tape. The metal plate 60 forming a rear side of each of the display modules 30A to 30P may be bonded directly to the frame 15 by the fixing member 82, and accordingly, the display modules 30A to 30P may be supported by the frame 15.

As described above, the metal plate 60 may be in contact with the substrate 40. The metal plate 60 may be bonded with the substrate 40 by a rear adhesive tape 61 positioned between the rear surface 43 of the substrate 40 and the metal plate 60.

FIG. 5 shows the substrate 40 from which components such as the anisotropic conductive layer 47 are excluded, for convenience of description. Also, although the side wiring 46 includes the coating member 46*e* for protecting the side wiring 46 from outside, the coating member 46*e* is omitted for convenience of description.

The metal plate 60 may be formed of a metal material having high thermal conductivity. For example, the metal plate 60 may be formed of an aluminum material.

Heat generated by the TFT layer 44 and the plurality of inorganic light-emitting devices 50 mounted on the substrate 40 may be transferred to the metal plate 60 through the rear adhesive tape 61 along the rear surface 43 of the substrate 40.

Accordingly, heat generated by the substrate 40 may be easily transferred to the metal plate 60, and temperature of the substrate 40 may be prevented from rising to certain temperature or higher.

The plurality of display modules 30A to 30P may be arranged at various locations in a M*N matrix form. The display modules 30A to 30P may be independently movable. In this case, because each of the display modules 30A to 30P includes the metal plate 60, a constant level of heat dissipation performance may be maintained regardless of the locations of the display modules 30A to 30P.

The display apparatus 1 may form screens having various sizes by arranging the display modules 30A to 30P in various forms of M*N matrixes. Therefore, by including the metal plate 60 in each of the display modules 30A to 30P to cause each of the display modules 30A to 30P to dissipate heat independently, instead of dissipating heat through a single metal plate for temporary heat dissipation, total heat dissipation performance of the display apparatus 1 may be improved.

In a case in which a single metal plate is positioned inside the display apparatus 1, the metal plate may be not positioned at locations corresponding to some display modules with respect to a front-rear direction, while being positioned at locations where no display modules are positioned, which lowers heat dissipation efficiency of the display apparatus 1.

That is, by arranging the metal plate 60 in each of the display modules 30A to 30P to cause each of the display modules 30A to 30P to dissipate heat at any location through the metal plate 60, the total heat dissipation performance of the display apparatus 1 may be improved.

The metal plate 60 may be provided in a shape of a rectangle substantially corresponding to a shape of the substrate 40.

An area of the substrate 40 may be at least equal to or larger than an area of the metal plate 60. Upon a parallel arrangement of the substrate 40 and the metal plate 60 in the first direction X, the four edges E of the substrate 40 being in the shape of the rectangle may correspond to four edges of the metal plate 60 with respect to a center of the substrate 40 and the metal plate 60, or the four edges E of the substrate 40 may be positioned at outer locations than the four edges of the metal plate 60 with respect to the center of the substrate 40 and the metal plate 60.

The four edges E of the substrate 40 may be positioned at the outer locations than the four edges of the metal plate 60. That is, the area of the substrate 40 may be larger than the area of the metal plate 60.

Upon transferring of heat to the display modules 30A to 30P, the substrate 40 and the metal plate 60 may be heat-expanded. Because the metal plate 60 has a greater coefficient of thermal expansion than the substrate 40, a degree of expansion of the metal plate 60 may be greater than a degree of expansion of the substrate 40.

In a case in which the four edges E of the substrate 40 correspond to the four edges of the metal plate 60 or are positioned at inner locations than the four edges of the metal plate 60, the edges of the metal plate 60 may protrude to outside of the substrate 40.

Accordingly, separation distances of gaps formed between the display modules 30A to 30P may become irregular due to heat-expansion of the metal plate 60 of each of the display modules 30A to 30P, and visibility of some seams may rise, resulting in deterioration in sense of unity of a screen of the display panel 20.

However, by positioning the four edges E of the substrate 40 at the outer locations than the four edges of the metal plate 60, the metal plate 60 may not protrude to the outside of the four edges E of the substrate 40 although the substrate 40 and the metal plate 60 are heat-expanded, and accordingly, the gaps formed between the display modules 30A to 30P may be maintained with regular separation distances.

In some embodiments, the area of the substrate 40 may substantially correspond to the area of the metal plate 60. Accordingly, heat generated from the substrate 40 may be uniformly dissipated over the entire area of the substrate 40 without being isolated in some areas.

The metal plate 60 may be bonded on the rear surface 43 of the substrate 40 by the rear adhesive tape 61.

The rear adhesive tape 61 may have a size corresponding to the metal plate 60. That is, an area of the rear adhesive tape 61 may correspond to the area of the metal plate 60. The metal plate 60 may be substantially in a shape of a rectangle, and the rear adhesive tape 61 may also be in a shape of a rectangle correspondingly.

The edges of the metal plate 60 being in the shape of the rectangle may correspond to the edges of the rear adhesive tape 61 being in the shape of the rectangle with respect to a center of the metal plate 60 and the rear adhesive tape 61.

Accordingly, the metal plate 60 and the rear adhesive tape 61 may be easily manufactured as a coupled configuration, thereby increasing manufacturing efficiency of the display apparatus 1.

That is, before a plate is cut into unit pieces to form the metal plate 60, the rear adhesive tape 61 may be bonded on the plate and then the rear adhesive tape 61 and the plate may be cut together into unit pieces to form the metal plate 60, thereby reducing a number of processes.

Heat generated from the substrate 40 may be transferred to the metal plate 60 through the rear adhesive tape 61. Accordingly, the rear adhesive tape 61 may bond the metal plate 60 on the substrate 40, while transferring heat generated from the substrate 40 to the metal plate 60.

Accordingly, the rear adhesive tape 61 may include a material having high heat dissipation performance.

The rear adhesive tape 61 may include, basically, a material having an adhesive property to bond the substrate 40 with the metal plate 60.

Additionally, the rear adhesive tape 61 may include a material having high heat dissipation performance rather than materials having an adhesive property. Accordingly, the rear adhesive tape 61 may efficiently transfer heat between the substrate 40 and the metal plate 60.

Also, the material having the adhesive property, included in the rear adhesive tape 61, may be a material having higher heat dissipation performance than adhesive materials constituting existing adhesives.

The material having the higher heat dissipation performance may be a material capable of effectively transferring heat because the material has high heat conductivity, high heat transfer performance, and low specific heat.

For example, the rear adhesive tape 61 may include a graphite material, although not limited thereto. However, the rear adhesive tape 61 may be formed of any material having high heat dissipation performance.

Flexibility of the rear adhesive tape 61 may be greater than flexibility of the substrate 40 and the metal plate 60. Accordingly, the rear adhesive tape 61 may be formed of a material having an adhesive property, heat dissipation, and high flexibility. The rear adhesive tape 61 may be a baseless double-sided tape. In this case, the rear adhesive tape 61 may be formed as a single layer of which one side is bonded on the substrate 40 and the other side is bonded on the metal plate 60, without having any base supporting the one side and the other side.

Because the rear adhesive tape 61 includes no base, the rear adhesive tape 61 may include no material interfering with heat conduction, and accordingly, heat dissipation performance may increase. However, the rear adhesive tape 61 is not limited to a baseless double-sided tape, and may be a heat dissipation tape having higher heat dissipation performance than existing double-sided tapes.

The rear adhesive tape 61 may be formed of a material having high flexibility to absorb an external force transferred from the substrate 40 and the metal plate 60. More specifically, flexibility of the rear adhesive tape 61 may be higher than flexibility of the substrate 40 and the metal plate 60.

Accordingly, upon transferring of an external force generated by changed sizes of the substrate 40 and the metal plate 60 by heat transferred to the substrate 40 and the metal plate 60 to the rear adhesive tape 61, the rear adhesive tape 61 may be deformed to prevent the external force from being transferred to the other components.

The rear adhesive tape 61 may have a certain thickness in the first direction X. The metal plate 60 may be heat-expanded by heat or cooled to be contracted. In this case, the metal plate 60 may be expanded or contracted in the first direction X and directions that are orthogonal to the first direction X, and accordingly, an external force may be transferred to the substrate 40.

As described above, because the metal plate 60 is formed with a size corresponding to the substrate 40 and covers the entire of the rear surface 43 of the substrate 40, a fixing member 82 may be positioned on a rear surface of the metal plate 60, although not limited thereto.

However, the fixing member 82 may be positioned on the rear surface 43 of the substrate 40. In this case, the substrate 40 may be bonded directly on the frame 15 through the fixing member 82.

The metal plate 60 may cover only a portion of the rear surface 43 of the substrate 40, and the fixing member 82 may be bonded on an area not covered by the metal plate 60 in the rear surface 43 of the substrate 40.

The fixing member 82 may be a double-sided tape.

Hereinafter, the front cover 70, a side cover 90, and a side end member 100 will be described in detail.

FIG. 6 is a cross-sectional view of some components of the display apparatus shown in FIG. 1, taken along the third direction, and FIG. 7 is an enlarged cross-sectional view of the some components shown in FIG. 6.

The front cover 70 may protect the substrate 40 from an external force, deteriorate visibility of a seam caused by a gap G formed between the plurality of display modules 30A to 30P, and improve color deviation between the plurality of display modules 30A to 30P.

The plurality of display modules 30A to 30P may include the side cover 90 positioned in the gap G formed between the plurality of display modules 30A to 30P upon an arrangement of the plurality of display modules 30A to 30P.

To absorb light reflected in the gap G between the plurality of display modules 30A to 30P, the front cover 70 of each of the display modules 30A to 30P may extend to the outside of the substrate 40 of the display module 30A to 30P. A side end 75 of the front cover 70 may extend up to the outside of the mounting surface 41.

More specifically, the front cover 70 may extend up to an outer location than an edge (or referred to as a side end) 41S of the mounting surface 41 of the substrate 40 in the second direction Y and the third direction Z.

Substantially, a gap G between the display modules 30A to 30P may be formed between the side surfaces 45 of the substrates 40 of the display modules 30A to 30P. However, the gap G may represent a non-display area that may be generated between the display modules 30A to 30P, and therefore, the gap G formed between the plurality of display modules 30A to 30P may be a space formed between the edges 41S of the mounting surfaces 41 of the substrates 40 of neighboring ones of the display modules 30A to 30P.

Accordingly, the gap G formed between the plurality of display modules 30A to 30P may represent a space formed between the edges 41S of the mounting surfaces 41 of the display modules 30A to 30P being adjacent to each other in the second direction Y or the third direction Z.

The front cover 70 extending from the display modules 30A to 30P may be positioned in the gap G between the display modules 30A to 30P to absorb light irradiated toward the gap G or light reflected in the gap G, thereby reducing visibility of a seam.

Also, the side cover 90 of the display modules 30A to 30P, positioned in the gap G, may absorb light irradiated toward the gap G, thereby reducing visibility of a seam, which will be described below.

As shown in FIGS. 6 and 7, the front cover 70 may extend to the outside of the substrate 40 in the third direction Z. More specifically, the front cover 70 may extend up to an outer location than the side surface 45 and the chamfer portion 49 in the third direction Z.

A description about only an edge of the substrate 40 corresponding to the lower edge 34 of the first display module 30A will be given, however, the front cover 70 may extend up to outer locations than the four edges E of the substrate 40 in the second direction Y or the third direction Z.

The side end 75 of the front cover 70, corresponding to an edge of the front cover 70, may extend up to the outside of the substrate 40 farther than the four edges E of the substrate 40, that is, up to the outside of the mounting surface 41, in the second direction Y or the third direction Z.

The front cover 70 may include a plurality of layers having different optical properties, although not shown in the drawings. The plurality of layers may have a structure resulting from stacking layers in the first direction X.

The plurality of layers may constitute the front cover 70 by being bonded in the first direction X.

One of the plurality of layers may be an anti-glare layer, although not limited thereto. However, the layer may be an anti-reflective layer or a layer formed by combining an anti-glare layer with an anti-reflective layer.

Another one of the plurality of layers may be a light transmittance adjustable layer, although not limited thereto. However, the layer may be a layer having another physical property or including another material, or a layer having another function. For example, the layer may be a circularly polarized layer.

However, the front cover 70 may include a single layer, instead of the plurality of layers. The single layer may be a layer capable of implementing all functions of the plurality of layers.

As described above, the front cover 70 may include an adhesive layer. The adhesive layer may be positioned at a hindmost location of the plurality of layers in the first direction X and bonded on the mounting surface 41. The adhesive layer may have a height that is greater than or equal to a preset height in the first direction X in which the mounting surface 41 or the light-emitting surface 54 faces. The reason may be to cause the adhesive layer bonded on the substrate 40 to sufficiently fill a gap that may be formed between the adhesive layer and the plurality of inorganic light-emitting devices 50.

However, the adhesive layer is not limited thereto, and the adhesive layer may be positioned as a separate component from the front cover 70 between the front cover 70 and the mounting surface 41 to bond the front cover 70 with the mounting surface 41.

Accordingly, because the front cover 70 is bonded with the mounting surface 41 in such a way as to be in close contact with the mounting surface 41 and protects components mounted on the mounting surface 41, the front cover 70 may be bonded directly to the substrate 40 without any additional molding component formed between the front cover 70 and the substrate 40.

The front cover 70 may diffuse and reflect light received from the outside to prevent the light from being specularly reflected to dazzle a user's eyes.

By diffusing and reflecting light received from the outside, a glaring phenomenon may be reduced, and accordingly, contrast of a screen displayed on the display panel 20 may be improved.

Also, the front cover 70 may reduce transmittance of incident external light or external light reflected from the substrate 40 and the gap G.

The front cover 70 may include a material capable of reducing transmittance of light, to absorb at least one part of light transmitted toward the substrate 40 or light reflected from the substrate 40 and then traveling toward the first direction X.

Some of a plurality of substrates may be manufactured with different colors due to a matter of process. Accordingly, substrates having different unique colors may be tiled to constitute a single display panel.

As described above, the front cover 70 may absorb at least one part of light reflected from the substrate 40 and transmitted to the outside, thereby raising a sense of unity of a screen displayed on the display panel 20.

That is, the front cover 70 may reduce color deviation of the display modules 30A to 30P generated during processes of the plurality of display modules 30A to 30P by lowering transmittance with respect to external light.

The front cover 70 may prevent external light entered the display panel 20 from the outside from being transmitted to the substrate 40, and additionally absorb a part of light entered the display panel 20 from the outside or a part of external light reflected from the substrate 40 and then transmitted to the outside of the display panel 20, thereby improving contrast of a screen that is displayed on the display panel 20. Such different optical actions may be respectively implemented by the plurality of layers described above.

That is, the front cover 70 may be positioned in front of the substrate 40 in the first direction X to improve contrast that may deteriorate by external light in a screen displayed on the display panel 20.

As described above, in the display module 30, the front cover 70 may extend up to the outside of the substrate 40 in the third direction Z.

Accordingly, a part of light entered the gap G formed between the plurality of display modules 30A to 30P may be blocked by at least a portion of the front cover 70 positioned in the gap G, and at least a part of external light entered the gap G or reflected in the gap G may be absorbed by the front cover 70 positioned in the gap G and thus be not transmitted to the outside. Accordingly, visibility of a seam that is formed in the gap G may deteriorate, and due to the deterioration of the visibility of the seam, a sense of unity of a screen that is displayed on the display panel 20 may be improved.

More specifically, the side end 75 of the front cover 70 in the third direction Z may be positioned at an outer location than the edge 41S of the mounting surface 41 in the second direction Y, or above the gap G.

Accordingly, the front cover 70 may include a first area 71 positioned at the outer location than the edge 41S of the mounting surface 41 in the third direction Z or above the gap G, and a second area 72 positioned above the mounting surface 41.

The first area 71 and the second area 72 of the front cover 70 may be partitioned by the gap G in the third direction Z.

Because the first area 71 of the front cover 70 is positioned above the gap G, external light irradiated toward the gap G may be blocked by the first area 71 of the front cover 70 or light reflected in the gap G may be prevented from being irradiated to the outside. Accordingly, visibility of a seam which is a boundary between the plurality of display modules 30A to 30P and which may be formed by the gap G may be reduced, resulting in an improvement of a sense of unity of the display panel 20.

Because the front cover 70 extends up to the outer locations than the four edges 41S of the mounting surface 41 of the substrate 40, as described above, visibility of seams that may be formed at the edges of the plurality of display modules 30A to 30P may be reduced.

In the example of the first display module 30A and the second display module 30B, a first area 71A of a front cover 70A extending from the first display module 30A may be positioned in a gap G formed between the first display module 30A and the second display module 30B.

Above the gap G, neighboring side ends 75A and 75B of the front covers 70A and 70B of the first and second display modules 30A and 30B may be positioned.

Also, in the gap G, the side surfaces 45 and chamfer portions 49 of the first and second display modules 30A and 30B may be positioned.

A second area 72A of the front cover 70A of the first front cover 70A may be positioned above the mounting surface 41 of the first display module 30A.

A first area 71B of the front cover 70B of the second display module 30B, extending from the second display module 30B, may be positioned above the gap G formed between the first display module 30A and the second display module 30B, and a second area 72B of the front cover 70B of the second display module 30B may be positioned above the mounting surface 41 of the second display module 30B.

That is, in the gap G formed between the first display module 30A and the second display module 30B, the first areas 71A and 71B of the front covers 70A and 70B of the first and second display modules 30A and 30B may be positioned side by side in the third direction Y.

A length in third direction Y of the first area 71A or 71B of the front cover 70A or 70B of each of the first and second display modules 30A and 30B may be substantially smaller than or equal to half of a length of the gap G.

Accordingly, a sum of the lengths of the first areas 71A and 71B of the front covers 70A and 70B of the first and second display modules 30A and 30B, arranged side by side in the third direction Z, may substantially correspond to or be smaller than the length of the gap G.

In the case in which the first areas 71A and 71B of the front covers 70A and 70B of the first and second display modules 30A and 30B are arranged side by side in the third direction Z, the side end 75A of the front cover 70A of the first display module 30A may be spaced from the side end 75B of the front cover 70B of the second display module 30B. Such spacing may be caused by the side end member 100 (which will be described below) positioned at the side ends of the display modules 30A to 30P.

The first area 71A of the front cover 70A of the first display module 30A and the first area 71B of the front cover 70B of the second display module 30B may be positioned above the gap G between the first display module 30A and the second display module 30B, as described above.

External light entered the display panel 20 may be diffused and reflected to the outside of the display panel 20 while being transmitted through the first areas 71A and 71B of the front covers 70A and 70B of the first and second display modules 30A and 30B, or a part of the external light may be absorbed in the first areas 71A and 71B. Accordingly, an amount of the external light arrived at the gap G may be reduced, which reduces visibility of a boundary between the first display module 30A and the second display module 30B, caused by the gap G.

Also, light reflected in the gap G and then traveling to the outside of the display panel 20 may be diffused and reflected to the outside of the display panel 20 while being transmitted through the first areas 71A and 71B of the front covers 70A and 70B of the first and second display modules 30A and 30B, or a part of the light may be absorbed in the first areas 71A and 71B. Accordingly, an amount of light transmitted to the outside of the display panel 20 may be reduced, which reduces visibility of the boundary between the first display module 30A and the second display module 30B, caused by the gap G.

That is, by reducing an amount of external light entering the gap G formed between the plurality of display modules 30A to 30P while absorbing at least one part of the external light reflected in the gap G, a sense of unity of a screen displayed on the display panel 20 may be improved.

Additionally, although a substrate 40A of the first display module 30A and a substrate 40B of the second display module 30B have different colors, at least one part of external light reflected from the substrates 40A and 40B may be absorbed in the front covers 70A and 70B of the first and second display modules 30A and 30B. Accordingly, unique colors of the substrates 40A and 40B may be not recognized from the outside, which improves a sense of unity of a screen displayed on the display panel 20.

The display module 30A may include the side cover 90 positioned below the front cover 70 in the direction in which the mounting surface 41 faces and provided on the side surface 45 of the substrate 40.

More specifically, the side cover 90 may be positioned in a space defined by a lower surface 76 of the first area 71 of the front cover 70 in the first direction X, a lower surface of the anisotropic conductive layer 47, and the side surface 45 of the substrate 40 in the third direction Z.

Also, an edge 47S of the anisotropic conductive layer 47 of the display module 30 may be aligned with the side end 75 of the front cover 70 in the first direction X, which is not shown. In this case, the side cover 90 may be positioned in a space defined by the lower surface of the anisotropic conductive layer 47 in the first direction X and the side surface 45 of the substrate 40 in the third direction Z.

Also, the side end 47S of the anisotropic conductive layer 47 of the display module 30 may be aligned with the edge 41S of the mounting surface 41 in the first direction X, which is not shown in the drawings. In this case, the side cover 90 may be positioned in a space defined by the lower surface 76 of the first area 71 of the front cover 70 in the first direction X and the side surface 45 of the substrate 40 in the third direction Z.

The side cover 90 may be bonded with the lower surface 76 of the first area 71, the side surface 45, and at least a portion of the side wiring 46.

Herein, the lower surface 76 of the first area 71, which is at least a portion of the lower surface of the front cover 70, may be a rear surface of the adhesive layer (not shown) formed as the hindmost layer of the front cover 70.

Also, the side cover 90 may surround the entire of the chamber portion 49 formed between the mounting surface 41 and the side surface 45, as well as the side surface 45.

Because the side cover 90 surrounds the chamfer portion 49 formed between the mounting surface 41 and the side surface 45, the side cover 90 may fill the entire of a space that may be defined between the substrate 40 and the front cover 70.

Accordingly, the side cover 90 may prevent a foreign material or water from the outside from entering the space between the substrate 40 and the front cover 70.

The side wiring 46 may include a first end **46*a* connected with the rear pad 43*e*, a second end 46*c* connected with the front pad (not shown), a first end portion 46*b* including the first end 46*a* and including an area around the first end 46*a* in the side wiring 46, and a second end portion 46*d* including the second end 46*c* and including an area around the second end 46*c* in the side wiring 46**.

A front end of the side cover 90 in the first direction X may be in contact with the lower surface 76 of the front cover 90, as described above, and a rear end 92 of the side cover 90 in the first direction X may cover at least a portions of the side surface 45 and the side wiring 46 without covering the side surface 45 and a rear end of the side wiring 46 in the first direction X, as described above.

Accordingly, the rear end of the side surface 45 in the first direction X and the second end portion **46*d* of the side wiring 46 may be exposed to the outside, and a liquid such as water from the outside may permeate the side surface 45 and the second end portion 46*d* not covered by the side cover 90 to damage the side wiring 46 and electronic components connected with the side wiring 46, which will be described below. To avoid such damage, the display module 30 may further include a waterproof member 200 formed below the side cover 90 in the first direction X and sealing the first end portion 46*d***, although not limited thereto.

However, the side cover 90 may cover the entire of the side surface 45 and the side wiring 46 in the first direction X. That is, a front end portion of the side cover 90 in the first direction X may be positioned on the lower surface 76 of the front cover 70, and a rear end portion of the side cover 90 in the first direction X may extend from the front end portion and cover at least a portion of the metal plate 60. Accordingly, the side cover 90 may seal the entire of the side surface 45 and the side wiring 46 to prevent infiltration of a liquid such as water from the outside.

However, a case in which the side cover 90 covers at least a portions of the side surface 45 and the side wiring 46 will be described as an example, and accordingly, the waterproof member 200 which will be described below may be provided.

The side cover 90 may be in contact with the lower surface 76 of the first area 71, the chamfer portion 49 of the substrate 40, and the side surface 45. Accordingly, the side cover 90 may support the lower surface 76 of the first area 71, the chamfer portion 49 of the substrate 40, and the side surface 45.

The substrate 40 may be bonded with the front cover 70 by the front cover 70, as described above, and the side cover 90 may reinforce adhesiveness between the front cover 70 and the substrate 40. Accordingly, the side cover 90 may prevent the front cover 70 from escaping from the substrate 40.

That is, the side cover 90 may increase reliability of the display module 30A.

The side surface 45 of the substrate 40 may correspond to the four edges 41S of the mounting surface 41, as described above, and the first area 71 of the front cover 70 may extend up to outer locations than the four edges 41S of the mounting surface 41 in the second direction Y and the third direction Z in which the mounting surface 41 extends.

The side cover 90 may surround the lower surface 76 of the first area 71 and the side surface 45 corresponding to each of the four edges 41S of the mounting surface 41, along the four edges 41S of the mounting surface 41.

That is, the side cover 90 may seal all edges of a portion at which the substrate 40 is bonded with the front cover 70.

The side cover 45 may cover the lower surface 76 of the first area 71 and the side surface 45 in all directions that are orthogonal to the first direction X.

Accordingly, bonding between the front cover 70 and the substrate 40 may be improved, and the front cover 70 and the side surface 45 of the substrate 40 may be protected from an external force.

Also, a foreign material or water from the outside may be prevented from entering between the substrate 40 and the front cover 70, as described above. In addition, upon formation of a gap between the substrate 40 and the front cover 70 due to degradation of adhesion, outside water or a foreign material may be prevented from entering the gap.

Because the hindmost layer of the front cover 70 in the first direction X is the adhesive layer, as described above, the lower surface 76 of the first area 71 may be a rear surface of the adhesive layer.

Accordingly, upon exposure of the lower surface 76 of the first area 71 to the outside, a foreign material floating in the outside may be adhered to the lower surface 76 of the first area 71.

Upon an arrangement of the plurality of display modules 30A to 30P in a state in which a foreign material is adhered to the lower surface 76 of the first area 71, visibility of a seam generated between the plurality of display modules 30A to 30P may be raised by the foreign material adhered to the lower surface 76 of the first area 71.

However, because the display module 30A includes the side cover 90 and the side cover 90 covers the lower surface 76 of the first area 71, the display module 30A may prevent a foreign material from being adhered to the lower surface 76 of the first area 71.

Accordingly, visibility of a seam generated between the plurality of display modules 30A to 30P due to a foreign material adhered to the front cover 70 upon an arrangement of the plurality of display modules 30A to 30P may be reduced.

Also, current may flow to a plurality of electronic components mounted on the substrate 40 by an electrostatic discharge that occurs on the display modules 30A to 30P to damage the electronic components. The side cover 90 may seal the substrate 40 from the outside and thus block charges generated by an electrostatic discharge from entering the substrate 40, to prevent the electronic components from being damaged, which will be described later.

That is, because the substrate 40 is sealed by the front cover 70 and the side cover 90, charges generated by an electrostatic discharge may be prevented from passing through the front cover 70 and the side cover 90 and thus flowing to the substrate 40. Also, charges flowing on the front cover 70 and the side cover 90 may be guided to the metal plate 60 being in contact with the side cover 90, thereby providing a path for current generated by an electrostatic discharge. Accordingly, electrostatic discharge (ESD) internal pressure of the electronic components mounted on the substrate 40 may be improved, although not limited thereto.

However, the side cover 90 may cover only the side surfaces 45 on which the side wiring 46 extends among the four side surfaces 45 of the substrate 40 by focusing on protecting the side wiring 46. In some embodiments, the side cover 90 may be positioned only on the side surfaces 45 corresponding to the upper edge 32 and the lower edge 34 on which the side wiring 46 extends.

That is, the side cover 90 may cover only the side surfaces 45 on which the side wiring 46 extends among the four side surfaces 45 to primarily protect the side wiring 46 and the electronic components connected with the side wiring 46, which are vulnerable to damage upon entering of a foreign material from the outside or an electrostatic discharge.

As described above, the display module 30A may be positioned below the front cover 70 in the direction in which the mounting surface 41 faces. That is, the side cover 90 may be not positioned above the lower surface 76 in the first direction X.

A foremost surface of the side cover 90 in the first direction X may be in contact with the lower surface 76 of the first area 71, and may be not positioned before the lower surface 76 of the first area 71 in the first direction X.

The reason may be not to locate the side cover 90 on a traveling path of light emitted from the plurality of inorganic light-emitting devices 50.

In a case in which at least a portion of the side cover 90 is positioned before the lower surface 76 or the front cover 70 in the first direction X, the at least a portion of the side cover 90 may be positioned on a traveling path of light traveling forward through the front cover 70.

That is, the side cover 90 may absorb or diffuse and reflect a part of traveling light to distort an area of an image displayed on the display panel 20.

However, because the side cover 90 is positioned behind the front cover 70 in the first direction X, the side cover 90 may not limit traveling of light emitted from the plurality of light-emitting devices 50, thereby improving image quality of the display panel 20.

The side end 75 of the front cover 70 in the third direction Z and a side end portion 91 of the side cover 90 in the third direction Z may be substantially aligned in the first direction X.

The reason may be because the front cover 70 and the side cover 90 are cut simultaneously in a process of manufacturing the display module 30A. Also, the side end member 100 may be bonded with the side end 75 of the front cover 70 and the side end portion 91 of the side cover 90, substantially aligned in the first direction X.

That is, a space that may be formed between the plurality of display modules 30A to 30P upon an arrangement of the plurality of display modules 30A to 30P may be reduced, and visibility of a seam that is caused by the space between the plurality of display modules 30A to 30P may be reduced.

The side cover 90 may include a light absorbing material. For example, the side cover 90 may be formed of an opaque or translucent material.

Also, the side cover 90 may include a photosensitive material. For example, the side cover 90 may be formed of a photosensitive OCR. The photosensitive material may change physical properties to show a dark color by receiving external light, such as ultraviolet (UV) light, having a wavelength that is different from a wavelength of visible light.

Accordingly, by irradiating UV light to the side cover 90 during a manufacturing process to color the side cover 90 with a dark color, the side cover 90 may be provided as a light absorbing member.

The side cover 90 may have a dark color. The side cover 90 may have a darker color than the front cover 70.

The side cover 90 may have a similar color to that of the black matrix 48.

Accordingly, light entered the side cover 90 may be absorbed in the side cover 90 without being reflected, by the light absorbing member of the side cover 90.

The side cover 90 may be positioned in the gap G formed between the plurality of display modules 30A to 30P, together with the first area 71 of the front cover 70, upon an arrangement of the plurality of display modules 30A to 30P.

Accordingly, by absorbing light entered the gap G, an amount of light reflected and then emitted to the outside among the light entered the gap G may be reduced. Therefore, visibility of a seam formed by the gap G between the plurality of display modules 30A to 30P may be reduced.

In the example of the first display module 30A and the second display module 30E, the side cover 90A of the first display module 30A and the side cover 90B of the second display module 30B may be positioned in the gap G formed between the first display module 30A and the second display module 30B, together with the first area 71A of the front cover 70A of the first display module 30A and the first area 71B of the front cover 70B of the second display module 30B.

In the gap G, the side end portion 91A of the side cover 90A of the first display module 30A and the side end portion 91B of the side cover 90B of the second display module 30B may be positioned together with the neighboring side ends 75A and 75B of the front covers 70A and 70B of the first and second display modules 30A and 30B.

The neighboring side ends 75A and 75B of the front covers 70A and 70B of the first and second display modules 30A and 30B and the neighboring side end portions 91A and 91B of the side covers 90A and 90B of the first and second display modules 30A and 30B may be opposite to each other. The neighboring side ends 75A and 75B of the front covers 70A and 70B of the first and second display modules 30A and 30B and the neighboring side end portions 91A and 91B of the side covers 90A and 90B of the first and second display modules 30A and 30B may be positioned in parallel to each other.

That is, in the gap G formed between the first display module 30A and the second display module 30B, the first areas 71A and 71B of the front covers 70A and 70B of the first and second display modules 30A and 30B and the side covers 90A and 90B of the first and second display modules 30A and 30B may be positioned in parallel in the third direction Z.

A length in third direction Z of each of the side covers 90A and 90B of the first and second display modules 30A and 30B may be substantially smaller than or equal to half of the length of the gap G to correspond to each of the first areas 71A and 71B of the front covers 70A and 70B of the first and second display modules 30A and 30B.

In the gap G between the first display module 30A and the second display module 30B, the first area 71A of the front cover 70A of the first display module 30A and the first area 71B of the front cover 70B of the second display module 30B may be positioned, and the side covers 90A and 90B of the first and second display modules 30A and 30B may be positioned behind the first areas 71A and 71B in the first direction X.

External light entered the display panel 20 may be diffused and reflected to the outside of the display panel 20 by being transmitted through the first areas 71A and 71B of the front covers 70A and 70B of the first and second display modules 30A and 30B, or a part of the external light may be absorbed in the first areas 71A and 71B of the front covers 70A and 70B. Accordingly, an amount of light arrived at the gap G may be reduced.

In addition, light arrived at the gap G may be absorbed in the side covers 90A and 90B of the first and second display modules 30A and 30B, positioned in the gap G, and accordingly, visibility of a boundary between the first display module 30A and the second display module 30B may be reduced.

That is, by reducing an amount of external light entering the gap G formed between the plurality of display modules 30A to 30P and additionally absorbing light arrived at the gap G, a sense of unity of a screen displayed on the display panel 20 may be improved.

In addition, light reflected from the side covers 90A and 90B of the first and second display modules 30A and 30B and then traveling to the outside of the display panel 20 without being absorbed in the side covers 90A and 90B may be diffused and reflected to the outside of the display panel 20 by being transmitted through the first areas 71A and 71B of the front covers 70A and 70B, or a part of the light may be absorbed in the first areas 71A and 71B. Accordingly, an amount of light transmitted to the outside of the display panel 20 may be reduced, and thus, visibility of the boundary between the first display module 30A and the second display module 30B, caused by the gap G, may be reduced.

Because the side cover 90 is positioned in the gap G formed between the plurality of display modules 30A to 30P upon an arrangement of the plurality of display modules 30A to 30P, as described above, the side cover 90 may absorb light arrived at the gap G to reduce visibility of a seam, caused by the gap G.

In the above-described example, the front cover 70 may diffuse and reflect, absorb, or circularly polarize a part of light entered the display panel 20, or change a reflection direction of the part of the light, thereby reducing an amount of light that arrives at the substrate 40, although not limited thereto.

However, the front cover 70 may be formed of a transparent material to transmit light without any deformation. In this case, visibility of the boundary between the plurality of display modules 30A to 30P, caused by the gap G, may be reduced by the side cover 90 positioned between the plurality of display modules 30A to 30P.

Because the side cover 90 is formed of a light absorbing material, as described above, a part of light emitted from the plurality of inorganic light-emitting devices 50 may be absorbed in the side cover 90 in a case in which at least a portion of the side cover 90 is positioned before the front cover 70 in the first direction X. Accordingly, a certain area of a screen displayed on the display panel 20 may appear dark.

However, because the side cover 90 is positioned below the front cover 70 in the first direction X, more specifically, below the lower surface 76 of the first area 71, the side cover 90 may not absorb light emitted from the plurality of inorganic light-emitting devices 50, and accordingly, an image displayed on the display panel 20 may have uniform brightness.

The anisotropic conductive layer 47 may be in a form of an anisotropic conductive film. The anisotropic conductive layer 47 may be adhered in a form of a film to the TFT layer 41.

Because the anisotropic conductive layer 47 is in the form of the film, an area of the anisotropic conductive layer 47 may be larger than an area of the substrate 40.

Accordingly, after the anisotropic conductive layer 47 is adhered to the TFT layer 44, a process of cutting the anisotropic conductive layer 47 to correspond the area of the anisotropic conductive layer 47 to the area of the substrate 40 may be performed.

The cutting process may be to cut the anisotropic conductive layer 47 through laser cutting, etc. to correspond the area of the anisotropic conductive layer 47 to the area of the substrate 40.

The anisotropic conductive layer 47 may have an area corresponding to an area of the mounting surface 41. However, it may be not easy to form the anisotropic conductive layer 47 as an anisotropic conductive film, as described above, of which an area corresponds to the area of the mounting surface 41, and, upon bonding of the anisotropic conductive film having the area corresponding to the mounting surface 41 onto the mounting surface 41, the anisotropic conductive film may have a smaller cross-sectional area than the mounting surface 41 due to manufacturing tolerance of the anisotropic conductive film, which deteriorates reliability of the display module 30.

Accordingly, by bonding an anisotropic conductive film having a larger area than the mounting surface 41 with the substrate 40 and then cutting the anisotropic conductive film to an area corresponding to the substrate 40, the anisotropic conductive layer 47 may be formed.

The side surface 45 of the substrate 40 may be positioned at an outer location than the mounting surface 41 by the chamfer portion 49. In this case, the anisotropic conductive film may be cut based on a side end of the coating member **46*e* forming a side end of the side wiring 46** in the third direction Z, although not limited thereto.

The reason may be because, as a result of cutting the anisotropic conductive film based on the mounting surface 41, the side surface 45 of the substrate 40, the chamfer portion 49, or the side wiring 46 may be damaged.

However, the anisotropic conductive layer 47 may be formed by cutting the anisotropic conductive film together with the front cover 70. The side end 47S of the anisotropic conductive layer 47 may be aligned with the side end 75 of the front cover 70 in the first direction X.

In this case, the side end 47S of the anisotropic conductive layer 47 may be exposed to the outside, and thus may be damaged by static electricity. However, reliability against ESD may be secured by the side end member 100 which will be described below.

Accordingly, upon cutting of the anisotropic conductive film, the side end 47S of the anisotropic conductive layer 47 may be positioned at an outer location than the mounting surface 41. More specifically, the anisotropic conductive film may be cut based on the side surface 45 or the side end of the side wiring 46. The side end 47S of the anisotropic conductive layer 47 may be aligned with the side surface 45 or the side end of the side wiring 46 in the first direction X. Also, due to manufacturing tolerance or burr molded in the anisotropic conductive film upon cutting, the anisotropic conductive layer 47 may be positioned at an outer location than the side surface 45 or the side end 46S of the side wiring 46.

However, to prevent breakage of the substrate 41, which may actually occur in a cutting process, a location at which the anisotropic conductive film is cut may be an outer location than the side surface 45 or the side end 46S of the side wiring 46.

Accordingly, the side end 47S of the anisotropic conductive layer 47 may be positioned outside the substrate 40. Particularly, the side end 47S of the anisotropic conductive layer 47 may be positioned at the outer location than the side cover 90.

The side cover 90 may cover both an outer side in third direction Z of the side surface 45 of the substrate 40 and an outer side in second direction Y of the side surface 45 of the substrate 40, as shown in FIG. 7.

The front cover 70 may be formed of a nonconductive material through which no charges are transmitted.

The side cover 90 may be formed of a nonconductive material through which no charges are transmitted.

Because the front cover 70 and the side cover 90 are formed of a nonconductive material, a major portion of current applied to the front cover 70 or the side cover 90 may float on the front cover 70 and the side cover 90 without being transmitted through the front cover 70 and the side cover 90.

Also, the metal plate 60 may be formed of a material having great capacitance, and function as a ground component. Accordingly, upon application of current to the metal plate 60, the metal plate 60 may be maintained at a constant potential, and the current applied to the metal plate 60 may be absorbed in the metal plate 60 without flowing to the substrate 40 through the metal plate 60.

Also, the entire of the side wiring 46 of the substrate 40 may be surrounded by the side cover 90, and accordingly, the side wiring 46 may be sealed without being exposed to the outside. Therefore, although an electrostatic discharge occurs at the side surface 45 of the substrate 40, no current may enter the side wiring 46 by the side cover 90.

In a process of manufacturing a display apparatus by implementing a display panel with display modules, a plurality of display modules may be tiled to form the display panel. In a process of forming the display panel with the display modules, current generated by an electrostatic discharge while the display modules are manufactured and delivered may enter the insides of the display modules to damage electronic components installed inside the display modules.

Particularly, during a process of manufacturing the display module 30, a defect may be generated, and in this case, the side wiring 46 extending along the side surface 45 of the substrate 40 may be exposed to the outside, or a space may be made between the anisotropic conductive layer 47 and the front cover 70 or the substrate 40, and an inside space may be made in a process of applying and hardening the side cover 90. In this case, according to an electrostatic discharge, current may enter electronic components, such as the side wiring 46, etc., mounted on the substrate 40, due to the defect, to damage the electronic components.

Each of the display modules 30A to 30P may independently include a component for blocking current generated by an electrostatic discharge from entering components mounted on the substrate 40, and the current generated by the electrostatic discharge may be easily guided to the metal plate 60 which is a ground component along the front cover 70 and the side cover 90 sealing the substrate 40 on each of the display modules 30A to 30P without entering the components mounted on the substrate 40.

To prevent current from entering, specifically, the side wiring 46 according to an electrostatic discharge, the display apparatus 1 may further include the side end member 100 positioned on an outer side end of the side cover 90 in the third direction Z of the display module 30 and formed of a material having higher conductivity than the side cover 90, although not limited thereto.

Because the side wiring 46 is positioned on the side surfaces 45 corresponding to the lower edge 34 and the upper edge 34 positioned in the third direction Z, as described above, the side end member 100 may be positioned on the outer side of the side cover 90 formed in the third direction Z in which the side wiring 46 is positioned, although not limited thereto.

The side end member 100 may also be positioned on the side surface 45 on which the side wiring 46 does not extend. Accordingly, the side end member 100 may be positioned on all of the four side surfaces 45 corresponding to the four edges 31, 32, 33, and 34.

The side end member 100 may easily guide static electricity to the metal plate 60 although the display modules 30A to 30P are insufficiently sealed due to a defect caused during a manufacturing process.

The side end member 100 may cover the outer side in third direction Z of the side surface 45 of the substrate 40, as shown in FIG. 7. That is, the side end member 100 may be positioned on the upper edge 32 and the lower edge 34 among the four edges of the substrate 40. The side end member 100 may be formed of a metal material, and may be formed of a material having higher conductivity than the side cover 90. The side end member 100 may be coated on the side cover 90 and positioned on the side end 91 of the side cover 90.

Accordingly, the side end member 100 may be positioned in the gap G formed between the display modules 30A to 30P upon an arrangement of the display modules 30A to 30P.

One end of the side end member 100 may be in contact with the metal plate 60, and the other end of the side end member 100 may be positioned on the side end 91 of the side cover 90. That is, the side end member 100 may cover at least one of the side cover 90 and at least a portion of the metal plate 60 in the third direction Z.

The side end member 100 may be in a form of a thin film. The reason may be because the side end member 100 is positioned in the gap G formed between the display modules 30A to 30P upon tiling of the display modules 30A to 30P. A great thickness of the side end member 100 may require a great gap G between the display modules 30A to 30P, which may cause visibility of a seam between the display modules 30A to 30P.

Accordingly, the side end member 100 may be provided as a thin film to reduce visibility of a seam.

The side end member 100 may be formed of a material having high conductivity. For example, the side end member 100 may be formed of a material, such as a metal, a conductive polymer, a conductive fabric, etc., which is capable of being electrically grounded to the metal plate 60.

The side end member 100 may be formed of a material having higher conductivity than the side cover 90. Also, the side end member 100 may be formed of a material having higher conductivity than the front cover 70.

Accordingly, current generated by an electrostatic discharge E1 on the front cover 70 or the side cover 90 may not enter the substrate 40 because the current is not transmitted through the front cover 70 or the side cover 90, and the current may float on the front cover 70 to enter the side end member 100.

The current entered the side end member 100 may enter the metal plate 60 through the side end member 100. The reason may be because the side end member 100 is in contact with the metal plate 60 and grounded to the ground component.

That is, the side end member 100 may provide a current path for causing current generated by an electrostatic discharge occurred on the front cover 70 or the side cover 90 to flow to the metal plate 60 provided as the ground component. The side end member 100 may guide charges generated by an electrostatic discharge to the ground.

Accordingly, because a major part of current generated by an electrostatic discharge on the front cover 70 or the side cover 90 flows to the metal plate 60 through the side end member 100 having high conductivity, ESD internal pressure of the electronic components mounted on the substrate 40 may be improved although some current flows to the substrate 40.

In addition, electrostatic current transferred to the metal plate 60 may escape to an external ground through a component, such as a bridge board or a cable, being in contact with the metal plate 60.

The side end member 100 may have a dark color. The side end member 100 may have a black color. The side end member 100 may have a darker color than the front cover 70.

The side end member 100 may have a similar color to that of the black matrix 48 or the side cover 90. Accordingly, light entered the side end member 100 may be absorbed in the side end member 100 without being reflected.

As described above, each of the display modules 30A to 30P may independently include the front cover 70, the side cover 90, the metal plate 60, and the side end member 100 to prevent infiltration of current generated according to an electrostatic discharge.

The side end member 100 may include a first end 101 and a second end 102 spaced from the first end 101 in the first direction X. More specifically, the first end 101 may be positioned on the side end 91 of the side cover 90 such that the side end member 100 covers at least a portion of the side cover 90. The second end 102 may cover a side surface 65 of the metal plate 60 and be in contact with the side surface 65 of the metal plate 60 such that the side end member 100 is grounded to the metal plate 60. Accordingly, the first end 101 may be positioned in front of the second end 102 in the first direction X.

The first end 101 may be positioned behind the front cover 70 in the first direction X. The first end 101 may be positioned behind the light-emitting surface 54 of the plurality of inorganic light-emitting devices 50 in the first direction X.

The side end member 100 may be positioned in the gap G, as described above. The reason may be because, in a case in which the first end 101 is positioned above the light-emitting surface 54 in the first direction X, the first end 101 may be recognized as a seam formed between the display modules 30A to 30P by light emitted from the plurality of inorganic light-emitting devices 50.

As described above, because the display panel 20 is formed by an array of the plurality of display modules 30A to 30P, a solution such as water flowing to the display panel 20 may enter the gap G formed between the plurality of display modules 30A to 30P to thus enter the side surfaces 45 of the plurality of display modules 30A to 30P.

In this case, although at least a portions of the side wiring 46 and the side surface 45 of each of the display modules 30A to 30P are sealed by the side cover 90, some areas of the side surface 45 and the side wiring 46 may be exposed to the outside, and accordingly, the side wiring 46, the rear pad 43*e* with which the side wiring 46 is connected, etc. may be damaged by the solution from the outside.

More specifically, because the first end portion 46*b* of the side wiring 46 and the rear pad 43*e* may be exposed to the outside without being sealed by the side cover 90, as described above, the first end portion 46*b* of the side wiring 46 and the rear pad 43*e* may be damaged upon an inflow of an external solution such as water.

To prevent such damage, the display modules 30A to 30P of the display apparatus 1 may include the waterproof member 200 for sealing the first end portion 46*b* of the side wiring 46 from the outside and preventing infiltration of a solution such as water.

The waterproof member 200 may be positioned below the rear end 92 of the side cover 90 in the first direction X. The first end portion 46*b* of the side wiring 46 positioned below the rear end 92 of the side cover 90 and the rear pad 43*e* connected with the side surface 45 and the side wiring 46 may be exposed to the outside without being covered by the side cover 90, and to prevent such exposure, the waterproof member 200 may cover the first end portion 46*b* of the side wiring 46 positioned below the rear end 92 of the side cover 90 and the rear pad 43*e* connected with the side surface 45 and the side wiring 46 to seal the first end portion 46*b* and the rear pad 43*e* from the outside.

The waterproof member 200 may be formed of a water repellent material. Accordingly, a solution such as water may fail to permeate the waterproof member 200 and may flow on the waterproof member 200, although not limited thereto.

However, the waterproof member 200 may be replaced by a waterproof material to prevent a solution from being absorbed therein to flow to the side wiring 46, the rear pad 43*e*, or the side surface 45.

The waterproof member 200 may be formed of a fluorine resin capable of repelling water on a surface of the waterproof member 200, although not limited thereto. However, the waterproof member 200 may be formed of any resin capable of repelling water on the surface of the waterproof member 200.

The waterproof member 200 may be positioned at an inner location than the side end 91 of the side cover 90 in the third direction Z. In a case in which the waterproof member 200 is positioned at an outer location than the side end 91 of the side cover 90 in the third direction Z, the gap G between the display modules 30A to 30P may increase, resulting in an increase of visibility of a seam.

Accordingly, the waterproof member 200 may be positioned at the rear end 92 of the side cover 90 and formed at the inner location than the side end 91 of the side cover 90 in the third direction Z.

Also, to prevent visibility of a seam from increasing by an increase of the gap G between the display modules 30A to 30P, a thickness of the waterproof member 200 may be substantially smaller than a thickness of the side end member 100. The reason may be to reduce a protrusion length of the side end member 100 in the third direction Z upon overlapping of the waterproof member 200 with the side end member 100 in the third direction Z at an area.

The waterproof member 200 may extend up to the rear surface 43 of the substrate 40 from the rear end 92 of the side cover 90, to cover all of the first end portion 46*b* of the side wiring 46 and the rear pad 34*e*.

Accordingly, an external solution entered the inside of the side end member 100 may be prevented from damaging components because the side surface 45, the side wiring 46, and the rear pad 43*e* are sealed from the outside by the side cover 90 and the waterproof member 200.

As described above, an external solution may be prevented from entering the inside of the side wiring 46 by the coating member 46*e* surrounding the side wiring 46 although the side wiring 46 is exposed to the outside.

However, an external solution having an alkaline base, such as a cleaning solution, may damage the side wiring 46 because the coating member 46*e* may be removed by the alkaline solution. Accordingly, an area of the side wiring 46, exposed to the outside, may be further covered by the waterproof member 200 to thereby prevent the side wiring 46 from being damaged.

The waterproof member 200 may be formed at the rear end 92 of the side cover 90, as described above, without being positioned at the side end 91 of the side cover 90.

The side end member 100 may cover the side cover 90, the waterproof member 200, and the metal plate 60 in the third direction Z, and be bonded with and fixed to the side end 91 of the side cover 90 and the side surface 65 of the metal plate 60.

The side end member 100 may be bonded with the side end 91 of the side cover 90 and the metal plate 60 by an adhesive, an adhesive tape, etc. formed on the inner surface 103 of the side end member 100.

In this case, because the waterproof member 200 is formed of a water repellent material, the waterproof member 200 may have low adhesion with the adhesive formed on the inner surface 103 of the side end member 100. Accordingly, in a case in which the waterproof member 200 is positioned on the side end 91 of the side cover 90, with which the side end member 100 is bonded, adhesion of the side end member 100 may be reduced, and thus, the side end member 100 may escape from the substrate 40. Accordingly, the waterproof member 200 may be not positioned on the side end 91 of the side cover 90.

In addition, in the case in which the waterproof member 200 is positioned on the side end 91 of the side cover 90, a length of each display module 30 in the third direction Z may increase, and thus, the gap G between the display modules 30A to 30P may increase. For this reason, the waterproof member 200 may be not positioned on the side end 91 of the side cover 90.

In a process of manufacturing the display module 30, the waterproof member 200 may be applied onto the rear end 92 of the side cover 90 after the front cover 70 is bonded with the substrate 40 and the side cover 90 is dispensed and hardened.

At this time, the waterproof member 200 may be applied to cover all of the first end portion 46*b* of the side wiring 46 and the rear pad 43*e* from the rear end 92 of the side cover 90.

Thereafter, the waterproof member 200 may be hardened, and the front cover 70 may be laser-cut to correspond to a size of the display module 30. The side cover 90 may be cut together with the front cover 70 to form the side end 91 of the side cover 90.

Because the side cover 90 is cut to form the side end 91 after the waterproof member 200 is applied, the waterproof member 200 may be not positioned on the side end 91 of the side cover 90.

In addition, the waterproof member 200 may be applied to be positioned at an outer location than the side end 91 of the side cover 90 in the third direction Z, and an area of the waterproof member 200, formed on the outer side of the side end 91, may be cut together with the front cover 70 and the side cover 90 upon the laser cutting. Accordingly, the waterproof member 200 may be positioned at an inner location than the side end 91 of the side cover 90 or at the same location as the side end 91 of the side cover 90 in the third direction Z.

Hereinafter, the display apparatus 1 according to another embodiment will be described. The other components except for a front waterproof member 210 and a rear waterproof member 220 which will be described below are the same as the corresponding ones of the display apparatus 1 as seen in FIG. 7 and as described above, and therefore, overlapping descriptions will be omitted.

Figure 8:
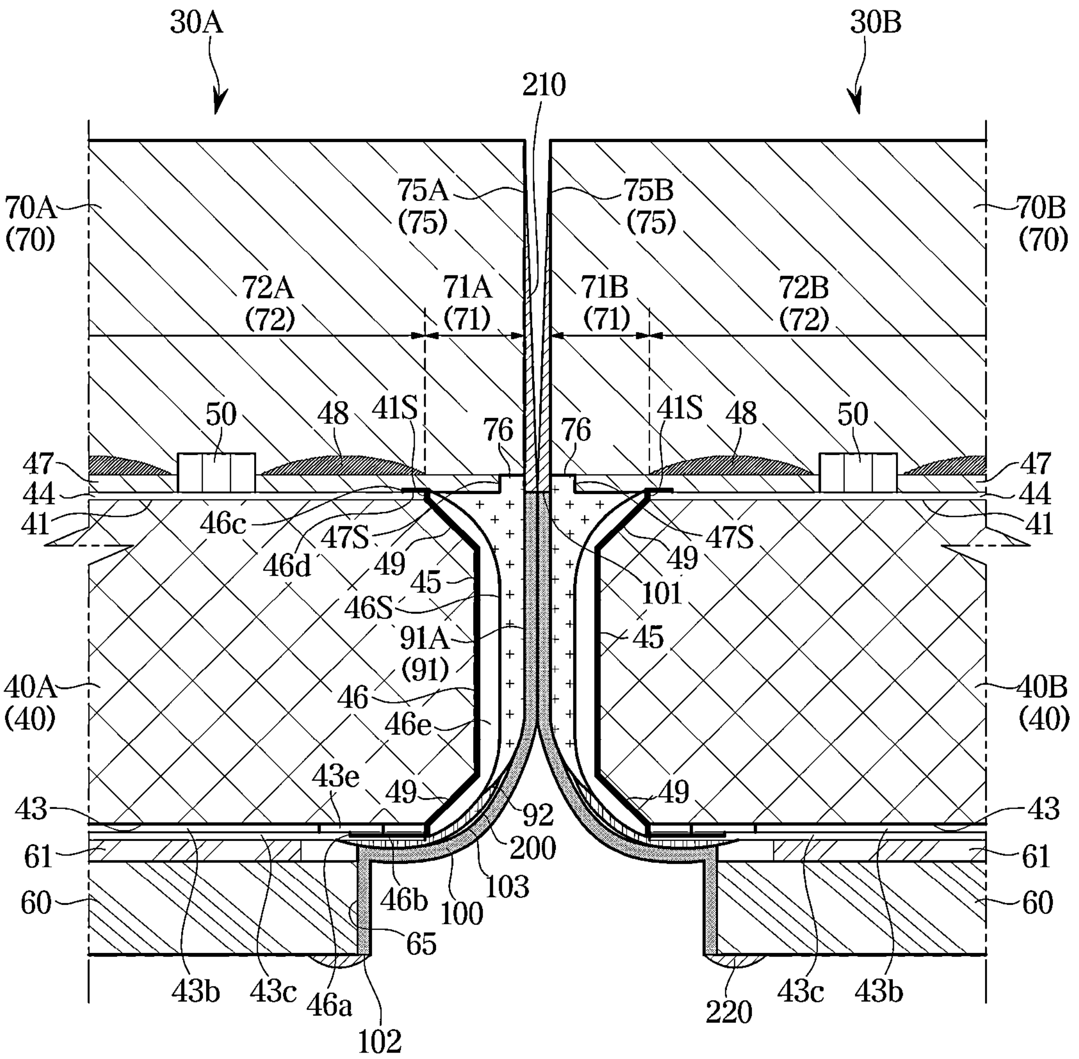
FIG. 8 is an enlarged cross-sectional view showing some components of a display apparatus according to another embodiment of the disclosure.

FIG. 8 is an enlarged cross-sectional view showing some components of a display apparatus according to another embodiment of the disclosure.

As shown in FIG. 8, the display module 30 may include the front waterproof member 210 extending from the first end 101 of the side end member 100 to at least a portion of the side end 75 of the front cover 70 and sealing between the side cover 90 and the front cover 70 from the outside.

A solution entered the display module 30 may infiltrate into the gap G between the display modules 30A to 30P from the front surface, as described above, and at this time, the solution may enter a boundary at which the front cover 70 contacts the side cover 90.

That is, a space may be made due to partial poor adhesion between the front cover 70 and the side cover 90, and a space may be made between the front cover 70 and the side cover 90 by the anisotropic conductive layer 47 during a process.

For these reasons, a space may be made, and a solution may enter the inside of the display module 30 through the space. Accordingly, the solution may reach the components mounted on the mounting surface 41 to damage the display module 30. To prevent such damage, the front waterproof member 210 may be provided to seal the boundary between the front cover 70 and the side cover 90 from the outside.

The front waterproof member 210 may be formed of a water repellent material. Accordingly, a solution such as water may fail to permeate the front waterproof member 210 and may flow on the front waterproof member 210, although not limited thereto.

However, the front waterproof member 210 may be replaced by a waterproof material to prevent a solution from being absorbed therein to flow between the front cover and the side cover 90.

The front waterproof member 210 may be formed of a fluorine resin capable of repelling water on a surface of the front waterproof member 210, although not limited thereto. However, the front waterproof member 210 may be formed of any resin capable of repelling water on the surface of the front waterproof member 210.

The front waterproof member 210 may be positioned in front of the side cover 90 in the first direction X. Accordingly, the front waterproof member 210 may be formed of a material capable of absorbing light.

For example, the front waterproof member 210 may have a black series color. The front waterproof member 210 may have a color that corresponds to or similar to the color of the side cover 90. The reason may be to reduce visibility of a seam that may be generated in the gap G between the display modules 30A to 30P.

In addition, the display module 30 may include the rear waterproof member 220 extending from the second end 102 of the side end member 100 to at least a portion of the metal plate 60 and sealing between the metal plate 60 and the side end member 100.

As described above, a solution entered the display module 30 may infiltrate into the gap G between the display modules 30A to 30P from the front surface, and at this time, the solution may enter the boundary at which the front cover 70 contacts with the side cover 90.

That is, a space may be made due to partial poor adhesion between the metal plate 60 and the side end member 100. A solution may enter the rear surface 43 of the substrate 40 through the space, and accordingly, the solution may infiltrate into the rear wiring layer 43*b*, the rear pad 43*e*, etc. formed on the rear surface 43 to damage the display module 30. To prevent such damage, the rear waterproof member 220 may be provided to seal a boundary between the metal plate 60 and the side end member 100 from the outside.

As described above, the side end member 100 may be bonded on the side surface 65 of the metal plate 60, and accordingly, the rear waterproof member 220 may seal the boundary between the side surface 65 of the metal plate 60 and the side end member 100 from the outside.

The rear waterproof member 220 may be formed of a water repellent material. Accordingly, a solution such as water may fail to permeate the rear waterproof member 220 and may flow on the rear waterproof member 220, although not limited thereto.

However, the rear waterproof member 220 may be replaced by a waterproof material to prevent a solution from being absorbed therein to flow to the rear surface 43 of the substrate 40.

The rear waterproof member 220 may be formed of a fluorine resin capable of repelling water on a surface of the rear waterproof member 220, although not limited thereto. However, the rear waterproof member 220 may be formed of any resin capable of repelling water on the surface of the rear waterproof member 220.

Hereinafter, a display apparatus 1 according to another embodiment will be described. The other components except for a waterproof member 300 which will be described below are the same as the corresponding ones of the display apparatus 1 as seen in FIGS. 7 and 8 and as described above, and therefore, overlapping descriptions will be omitted.

Figure 9:
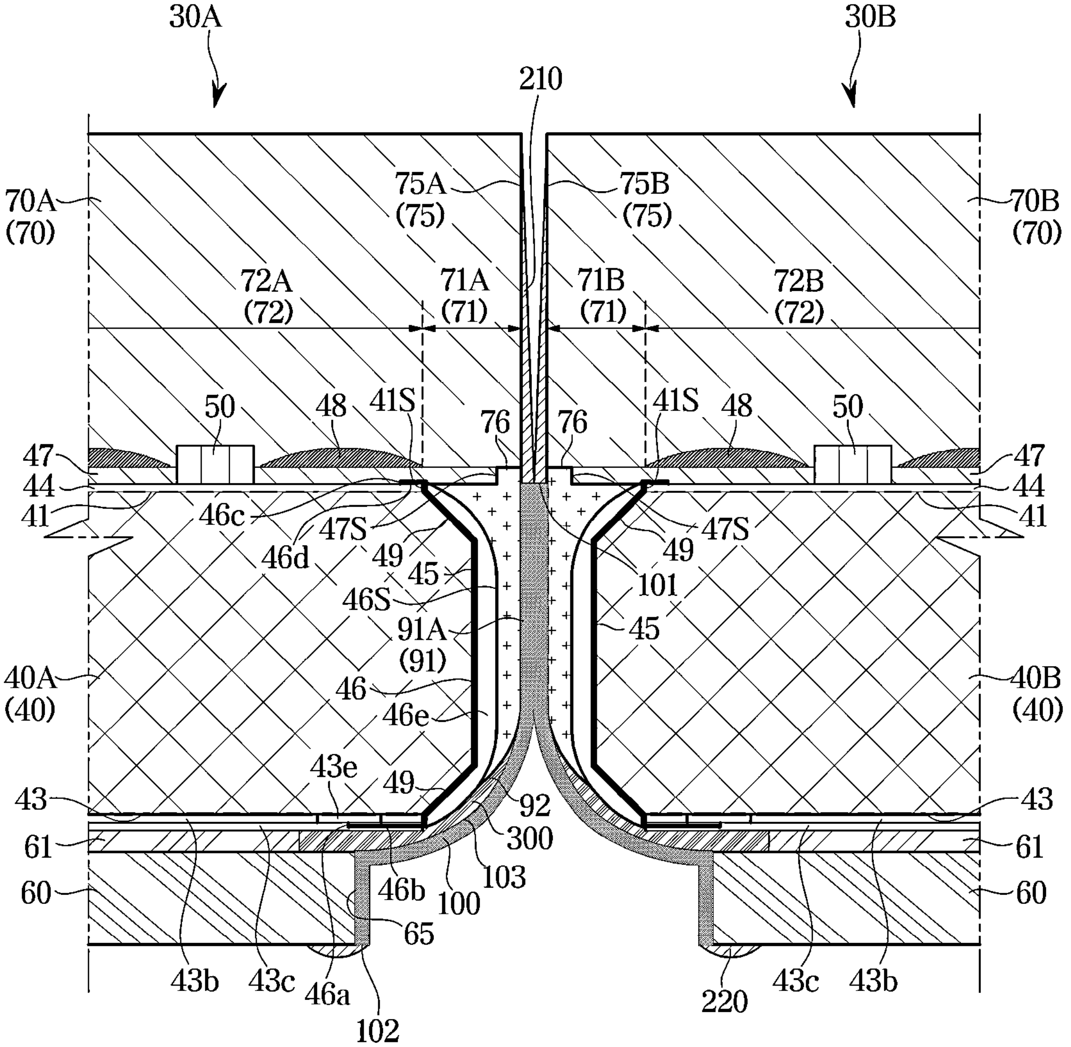
FIG. 9 is an enlarged cross-sectional view showing some components of a display apparatus according to another embodiment of the disclosure.

FIG. 9 is an enlarged cross-sectional view showing some components of a display apparatus according to another embodiment of the disclosure.

As shown in FIG. 9, the waterproof member 300 may be formed by being applied to cover the rear surface 43 of the substrate 40 from the rear end 92 of the side cover 90 and then hardened.

Upon applying of the waterproof member 300, the waterproof member 300 may be injected between the rear surface 43 of the substrate 40 and the metal plate 60 to cover the rear pad 43*e* formed on the rear surface 43 of the substrate 40, and the waterproof member 300 may be applied from the rear end 92 of the side cover 90 to cover the entire of the first end portion 46*b* of the side wiring 46.

The waterproof member 300 may be formed of an insulating material.

The waterproof member 300 may be formed of a waterproof material.

The waterproof member 300 may be formed of an insulating, waterproof material, such as an acrylic resin, a silicon resin, a UV curing resin, etc., and the waterproof member 300 may be applied in a space between the rear surface 43 of the substrate 40 and the metal plate 60 from the rear end 92 of the side cover 90 and then hardened.

The waterproof member 300 may be positioned on an inner location than the side end 91 of the side member 90 in the third direction Z.

The waterproof member 300 may be positioned at the inner location than the side end 91 of the side member 90 in the third direction Z by applying the waterproof member 300 and then cutting the waterproof member 300 together with the front cover 70 and the side cover 90 in a process of manufacturing the display module 30, or upon applying of the waterproof member 300 after the front cover 70 and the side cover 90 are cut, the waterproof member 300 may be dispensed to be positioned at the inner location than the side end 91 of the side member 90 in the third direction Z.

As shown in FIG. 9, the display module 30 may include the waterproof member 300 while including the front waterproof member 210 and the rear waterproof member 220, although not limited thereto. However, the display module 30 may include only the waterproof member 300 without including the front waterproof member 210 and the rear waterproof member 220.

The display apparatus may be sealed by the front cover in the front direction from each display module and by the side cover at the side of the display module, and the side wiring and the electronic components connected with the side wiring may be further sealed by the waterproof member, which contributes to an improvement of reliability against infiltration of an external solution.

Although the technical concept of the disclosure has been described based on specific embodiments, the scope of rights of the disclosure is not limited to these embodiments. It should be interpreted that various embodiments modified or changed by a person skilled in the art within a scope not deviating from the gist of the disclosure as the technical concept of the disclosure, which is defined in the claims, also belong to the scope of rights of the disclosure.

What is claimed is:

1. A display module comprising:

a substrate including:

a mounting surface on a first side of the substrate that faces a light-emitting direction, and on which a plurality of inorganic light-emitting devices are mounted and a thin film transistor (TFT) layer is formed, a rear surface on which a rear wiring layer is formed, the rear surface being opposite to the mounting surface, and on a second side of the substrate that faces away from the light-emitting direction, and a side surface formed between the mounting surface and the rear surface;

a side wiring extending along the side surface, the side wiring electrically connecting the TFT layer at a first end of the side wiring with the rear wiring layer at a second end of the side wiring;

a front cover disposed on and bonded with the mounting surface;

a metal plate disposed on and bonded with the rear surface;

a side cover covering the side wiring and the side surface;

a waterproof member configured to seal the second end of the side wiring from outside and prevent moisture permeation; and a side end member disposed on a side end of the side cover and covering the side cover and the waterproof member, and the side end member being grounded to the metal plate.

2. The display module of claim 1, wherein the waterproof member is made of a water repellent material.

3. The display module of claim 1, wherein the waterproof member is formed below the side cover.

4. The display module of claim 1, wherein the waterproof member is formed at an inner location than the side end of the side cover.

5. The display module of claim 3, wherein the front cover extends along the mounting surface beyond an outer area of the mounting surface, wherein the side cover extends from a lower surface of the front cover, corresponding to the outer area from the mounting surface, to at least a portion of the side surface, and wherein the waterproof member extends in a first direction and a second direction to cover the second end of the side wiring from a lower portion of the side cover.

6. The display module of claim 3, wherein the side end member is configured to cover at least a portion of the side end of the side cover in a direction in which the side surface faces, the waterproof member, and a side surface of the metal plate, and the side end member including a first end positioned on the side cover and a second end positioned on the side surface of the metal plate.

7. The display module of claim 6, further comprising a front waterproof member extending from the first end of the side end member to at least a portion of a side end of the front cover, the front waterproof member being configured to seal a region between the side cover and the front cover from the outside.

8. The display module of claim 7, further comprising a rear waterproof member extending from the second end of the side end member to at least a portion of the metal plate, the rear waterproof member being configured to seal a region between the side end member and the metal plate from the outside.

9. The display module of claim 6, further comprising a rear waterproof member extending from the second end of the side end member to at least a portion of the metal plate, the rear waterproof member being configured to seal a region between the side end member and the metal plate from the outside.

10. The display module of claim 1, wherein the waterproof member is not disposed on the side end of the side cover.

11. The display module of claim 1, wherein the waterproof member is less thick than the side end member.

12. The display module of claim 2, wherein the waterproof member includes a fluorine resin.

13. The display module of claim 1, wherein the side end member is made of metal.

14. The display module of claim 1, wherein the side cover is made of a light absorbing material.

15. A display panel comprising:

a plurality of display modules; and a frame configured to arrange the plurality of display modules adjacent to each other;

wherein each of the plurality of display modules comprises:

a substrate including:

a mounting surface on a first side of the substrate that faces a light-emitting direction, and on which a plurality of inorganic light-emitting devices are mounted and a thin film transistor (TFT) layer is formed, a rear surface on which a rear wiring layer is formed, the rear surface being opposite to the mounting surface, and on a second side of the substrate that faces away from the light-emitting direction, and a side surface formed between the mounting surface and the rear surface;

a side wiring extending along the side surface, the side wiring electrically connecting the TFT layer at a first end of the side wiring with the rear wiring layer at a second end of the side wiring;

a front cover disposed on and bonded with the mounting surface;

a metal plate disposed on and bonded with the rear surface;

a side cover covering the side wiring and the side surface;

a waterproof member configured to seal the second end of the side wiring from outside and prevent moisture permeation; and a side end member disposed on and covering the side cover and the waterproof member, and the side end member being grounded to the metal plate.

16. The display panel of claim 15, wherein a first direction is defined as a vector orthogonal to the front cover towards the metal plate, and wherein the waterproof member is disposed in the first direction with respect to the side cover.

17. The display panel of claim 15, wherein a second direction is defined as a vector orthogonal to the side cover towards the substrate, and wherein the waterproof member is disposed in the second direction with respect to the side cover.

18. The display panel of claim 17, wherein the front cover extends along the mounting surface in a third direction beyond an outer area of the mounting surface, the third direction being opposite to the second direction, wherein the side cover extends in a first direction from a lower surface of the front cover beyond the outer area of the mounting surface, and wherein the waterproof member extends in the first direction and the second direction to cover the second end of the side wiring from a lower portion of the side cover.

19. The display panel of claim 17, wherein the side end member is configured to cover at least a portion of the side cover in a third direction, the waterproof member, and a side surface of the metal plate, the side end member including a first end disposed on the side cover and a second end positioned on the side surface of the metal plate, the third direction being defined as a vector orthogonal to the side cover away from the substrate.

20. The display panel of claim 19, further comprising:

a front waterproof member extending from the first end of the side end member to at least a portion of a side end of the front cover, the front waterproof member being configured to seal a region between the side cover and the front cover from the outside; and a rear waterproof member extending from the second end of the side end member to at least a portion of the metal plate, the rear waterproof member being configured to seal a region between the side end member and the metal plate from the outside.

* * * * *